US012683628B2

(12) United States Patent
Tanio

(10) Patent No.: US 12,683,628 B2
(45) Date of Patent: Jul. 14, 2026

(54) DELTA-SIGMA MODULATION APPARATUS, DELTA-SIGMA MODULATION METHOD AND RECORDING MEDIUM

(71) Applicant: NEC Corporation, Tokyo (JP)

(72) Inventor: Masaaki Tanio, Tokyo (JP)

(73) Assignee: NEC CORPORATION, Tokyo (JP)

(*) Notice: Subject to any disclaimer, the term of this patent is extended or adjusted under 35 U.S.C. 154(b) by 116 days.

(21) Appl. No.: 18/901,966

(22) Filed: Sep. 30, 2024

(65) Prior Publication Data

US 2025/0132769 A1     Apr. 24, 2025

(30) Foreign Application Priority Data

Oct. 24, 2023    (JP) ................................. 2023-182515

(51) Int. Cl.
*H03M 3/00*        (2006.01)
*H03M 1/06*        (2006.01)
*H03M 3/02*        (2006.01)

(52) U.S. Cl.
CPC ............. *H03M 3/362* (2013.01); *H03M 3/39* (2013.01); *H03M 1/0602* (2013.01); *H03M 3/02* (2013.01)

(58) Field of Classification Search
CPC .......... H03M 3/362; H03M 3/39; H03M 3/02; H03M 1/0602
See application file for complete search history.

(56) References Cited

U.S. PATENT DOCUMENTS 6,501,405 B1 *  12/2002  Zhang ................... H03M 3/388
                                                                341/120
2017/0331490 A1   11/2017  Maehata
2023/0054311 A1    2/2023  Tanio et al.

FOREIGN PATENT DOCUMENTS

WO      2016/103981 A1    6/2016
WO      2023/021625 A1    2/2023

OTHER PUBLICATIONS

T. Maehata, S. Kameda, and N. Suematsu, "1-bit feedforward distortion compensation technology for bandpass delta-sigma modulation," IEICE Trans. Commun., vol. E99-B, No. 5, pp. 1087-1092, May 2016.
A. Frappe, A. Flament, B. Stefanelli, A. Kaiser, and A. Cathelin, "An all-digital RF signal generator using high-speed SD modulators," IEEE Journal of Solid-State Circuits, vol. 44, No. 10, pp. 2722-2732, Oct. 2009.
H. Li et al., "Real-Time 100-GS/s Sigma-Delta Modulator for All-Digital Radio-over-Fiber Transmission," J. Lightw. Technol. vol. 38, No. 2, pp. 386-393, Jul. 2019.

(Continued)

*Primary Examiner* — Joseph J Lauture
(74) *Attorney, Agent, or Firm* — Sughrue Mion, PLLC

(57)            ABSTRACT
A delta-sigma modulation apparatus performs delta-sigma modulation on a first signal as an input signal and outputs a second signal; learns a parameter for a transmission path distortion model using the second signal and a third signal generated through a transmission path of the second signal; inputs the second signal to the transmission path distortion model and outputs a fourth signal that is an approximated value of a signal which is generated through at least part of the transmission path of the second signal, and performs the delta-sigma modulation on the first signal using the fourth signal and outputs the second signal.

10 Claims, 16 Drawing Sheets

(56) References Cited

OTHER PUBLICATIONS

M. Tanio et al., "Wideband Delta-Sigma Radio-over-Fiber Embedding a Pulse-Distortion Model for Beyond 5G," 2022 IEEE 96th Vehicular Technology Conference (VTC2022-Fall), London, United Kingdom, 2022, pp. 1-5.

Song Han, Jeff Pool, John Tran, William J.Dally, "Learning both Weights and Connections for Efficient Neural Networks,", In Advances in Neural Information Processing Systems, 2015.

* cited by examiner

Fig. 6

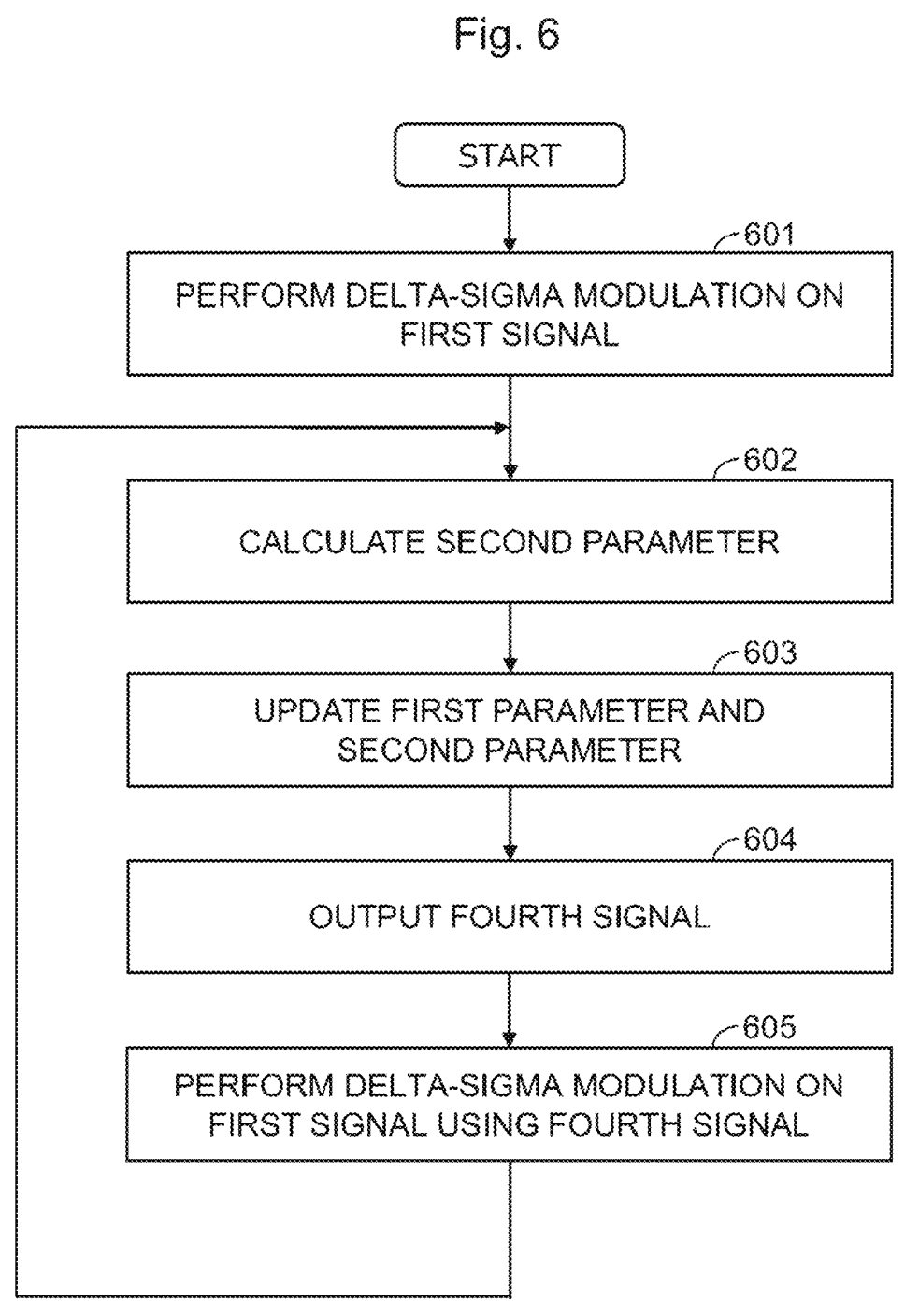

START

601
PERFORM DELTA-SIGMA MODULATION ON FIRST SIGNAL

602
CALCULATE SECOND PARAMETER

603
UPDATE FIRST PARAMETER AND SECOND PARAMETER

604
OUTPUT FOURTH SIGNAL

605
PERFORM DELTA-SIGMA MODULATION ON FIRST SIGNAL USING FOURTH SIGNAL

Fig. 14

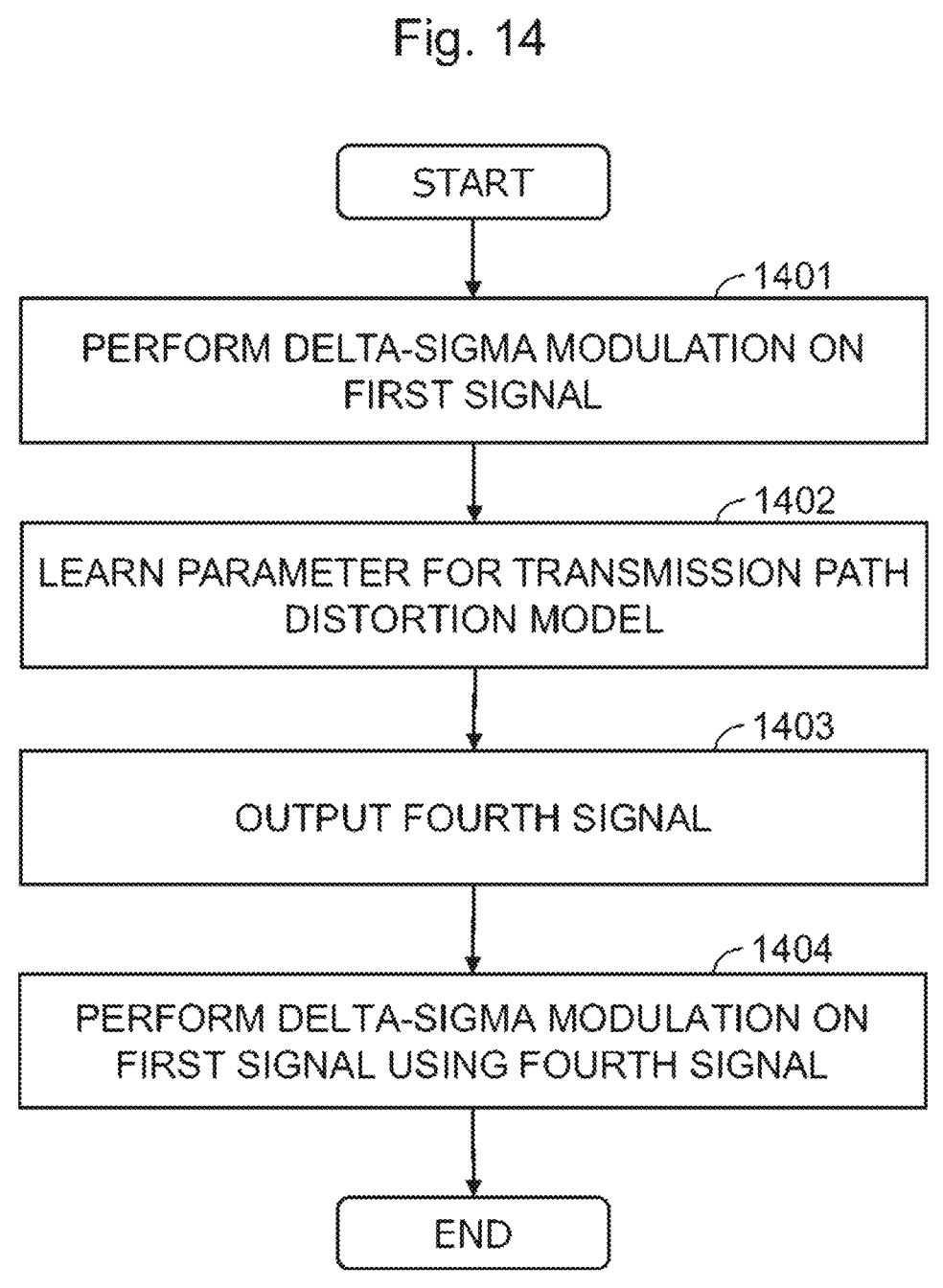

START

1401

PERFORM DELTA-SIGMA MODULATION ON
FIRST SIGNAL

1402

LEARN PARAMETER FOR TRANSMISSION PATH
DISTORTION MODEL

1403

OUTPUT FOURTH SIGNAL

1404

PERFORM DELTA-SIGMA MODULATION ON
FIRST SIGNAL USING FOURTH SIGNAL

END

DELTA-SIGMA MODULATION APPARATUS, DELTA-SIGMA MODULATION METHOD AND RECORDING MEDIUM

CROSS-REFERENCES TO RELATED APPLICATION

The present application claims priority to Japanese patent application No. JP 2023-182515 filed on Oct. 24, 2023, the content of which is hereby incorporated by reference in its entirety.

BACKGROUND

Technical Field

The present disclosure relates to a delta-sigma modulation apparatus and a delta-sigma modulation method.

Background Art

In the field of radio communication, the development of a technology for implementing high-speed communication is pursued in order to cope with an increase in traffic. In general, a radio communication apparatus needs to include a high-speed and high-precision Digital-to-Analog Converter (DAC) in order to implement high-speed communication. However, the problem is that such an apparatus consumes a large amount of power.

To solve this problem, delta-sigma modulation is sometimes used (see, for example, Patent Literature 1, Non Patent Literature 1, and Non Patent Literature 2). Delta-sigma modulation is processing to convert an analog signal as an input signal to a quantized signal (a pulse train). Delta-sigma modulation can reduce the resolution requirement of the DAC (to 1 bit in some cases). This makes it possible to reduce power consumption of the radio communication apparatus.

On the other hand, in the radio communication apparatus, a configuration in which a plurality of functions of a radio access network apparatus are distributed between physically separated two apparatuses is known. For example, a base station is divided into a Base Band Unit (BBU) and a Remote Unit (RU). Note that the RU may be referred to as a Remote Radio Unit (RRU), a Remote Radio Head (RRH), or a Remote Antenna Unit (RAU). The BBU and the RU are connected via a communication path (for example, an optical fiber). In this configuration, Radio over Fiber (RoF) technology is used for transmission of a signal between the BBU and the RU.

In recent years, a system using delta-sigma modulation and the RoF technology has been studied (see, for example, Patent Literature 2, Non Patent Literature 3, and Non Patent Literature 4). Hereinafter, such a system is referred to as the "RoF system". In the RoF system, a pulse train output by delta-sigma modulation is transmitted from the BBU to the RU via an optical fiber. In this case, the RU restores the pulse train to an original analog signal, which is not subjected to delta-sigma modulation, through an analog band-pass filter (BPF), for example. Since the RU does not have to include the DAC, it is possible to reduce power consumption of the RU.

[Patent Literature 1 (PTL1)] WO 2016/103981
[Patent Literature 2 (PTL2)] WO 2023/021625
[Non Patent Literature 1 (NPL1)]T. Maehata, S. Kameda, and N. Suematsu, "1-bit feedforward distortion compensation technology for bandpass delta-sigma modulation," IEICE Trans. Commun., vol. E99-B, no. 5, pp. 1087-1092, May 2016
[Non Patent Literature 2 (NPL2)]A. Frappe, A. Flament, B. Stefanelli, A. Kaiser, and A. Cathelin, "An all-digital RF signal generator using high-speed SD modulators," IEEE Journal of Solid-State Circuits, vol. 44, no. 10, pp. 2722-2732, October 2009
[Non Patent Literature 3 (NPL3)]H. Li et al., "Real-Time 100-GS/s Sigma-Delta Modulator for All-Digital Radio-over-Fiber Transmission," J. Lightw. Technol. vol. 38, no. 2, pp. 386-393, July 2019.
[Non Patent Literature 4 (NPL4)]M. Tanio et al., "Wideband Delta-Sigma Radio-over-Fiber Embedding a Pulse-Distortion Model for Beyond 5G," 2022 IEEE 96th Vehicular Technology Conference (VTC2022-Fall), London, United Kingdom, 2022, pp. 1-5.
[Non Patent Literature 5 (NPL5)] Song Han, Jeff Pool, John Tran, William J. Dally, "Learning both Weights and Connections for Efficient Neural Networks,", In Advances in Neural Information Processing Systems, 2015.

SUMMARY

Incidentally, as described in NPL1, it is known that a phenomenon called spectrum leakage occurs in a configuration using delta-sigma modulation due to distortion that occurs in a waveform. The spectrum leakage here is a phenomenon in which a signal component in a band around a desired frequency band (that is, a band other than a desired frequency band) appears.

PTL1 discloses a technology of compensating for distortion that occurs due to delta-sigma modulation itself. Specifically, the technology of Patent Literature 1 compensates for distortion caused by the asymmetry of a rising edge and a falling edge of a pulse in a pulse train. However, with the technology of Patent Literature 1, it is impossible to compensate for distortion that occurs in the process of transmission of a pulse train in the RoF system described above, for example.

On the other hand, in PTL 2 and NPL 4, a transmission path distortion model is incorporated into delta-sigma modulation, allowing distortion generated in a transmission path of a pulse train in an RoF system to be compensated. However, for example, a model of a related art described in PTL 2 is insufficient in the expressive degree, and distortion in a transmission path may not be reproduced.

The present disclosure provides a technique that allows distortion generated in a signal to be suppressed with accuracy higher than that in the related art described above, in a process where the signal (pulse train) output through delta-sigma modulation is transmitted.

In one or more example embodiments, a delta-sigma modulation apparatus is provided. The delta-sigma modulation apparatus includes one or more memories storing instructions, and one or more processors configured to execute the instructions. The one or more processors are configured to execute the instructions to perform delta-sigma modulation on a first signal as an input signal, and output a second signal; learn a parameter for a transmission path distortion model including at least a mixture model and a filter structure, using the second signal and a third signal generated through a transmission path of the second signal; and input the second signal to the transmission path distortion model, and output a fourth signal that is an approximated value of a signal which is generated through at least part of the transmission path of the second signal. The one or more processors are further configured to execute the instructions to perform the delta-sigma modulation on the first signal using the fourth signal, and output the second signal.

In one or more example embodiments, a delta-sigma modulation method is provided. The delta-sigma modulation method includes performing delta-sigma modulation on a first signal as an input signal, and outputting a second signal; learning a parameter for a transmission path distortion model including at least a mixture model and a filter structure, using the second signal and a third signal generated through a transmission path of the second signal; inputting the second signal to the transmission path distortion model, and outputting a fourth signal that is an approximated value of a signal which is generated through at least part of the transmission path of the second signal; and performing the delta-sigma modulation on the first signal using the fourth signal, and outputting the second signal.

The configuration described above allows distortion generated in a second signal to be suppressed in a process where the second signal (pulse train) output through delta-sigma modulation is transmitted. Issues, configurations, and effects other than above will be clarified by the following description of example embodiments.

BRIEF DESCRIPTION OF THE DRAWINGS

FIG. 6 is a flowchart illustrating a process flow of a delta-sigma modulation apparatus according to the present disclosure;

FIG. 14 is a flowchart illustrating a process flow of the delta-sigma modulation apparatus according to the present disclosure;

DESCRIPTION OF THE EXAMPLE EMBODIMENTS

Hereinafter, one or more example embodiments will be described with reference to the accompanying drawings. Note that each drawing is associated with the one or more example embodiments in the present disclosure. In the Specification and drawings, elements to which a similar description is applicable are denoted by the same reference sign, and overlapping descriptions may hence be omitted.

Descriptions will be given in the following order.
1. Overview of Example Embodiments
2. Example Embodiments
    2-1. Schematic Configuration of Wireless Communication Apparatus
    2-2. Configuration of Delta-sigma Modulator
    2-3. Configuration of Modeling Processor
    2-4. Configuration of Learner
    2-5. Process Flow of Delta-sigma Modulation Apparatus
    2-6. Example Alteration of Delta-sigma Modulator
    2-7. Example Alteration of Transmission Path Distortion Model
3. Other Example Embodiments
4. Hardware Configuration of Delta-sigma Modulation Apparatus

1. Overview of Example Embodiments

An overview of the one or more example embodiments to be described below will be described.

(1) Technical Issues

Figure 16:
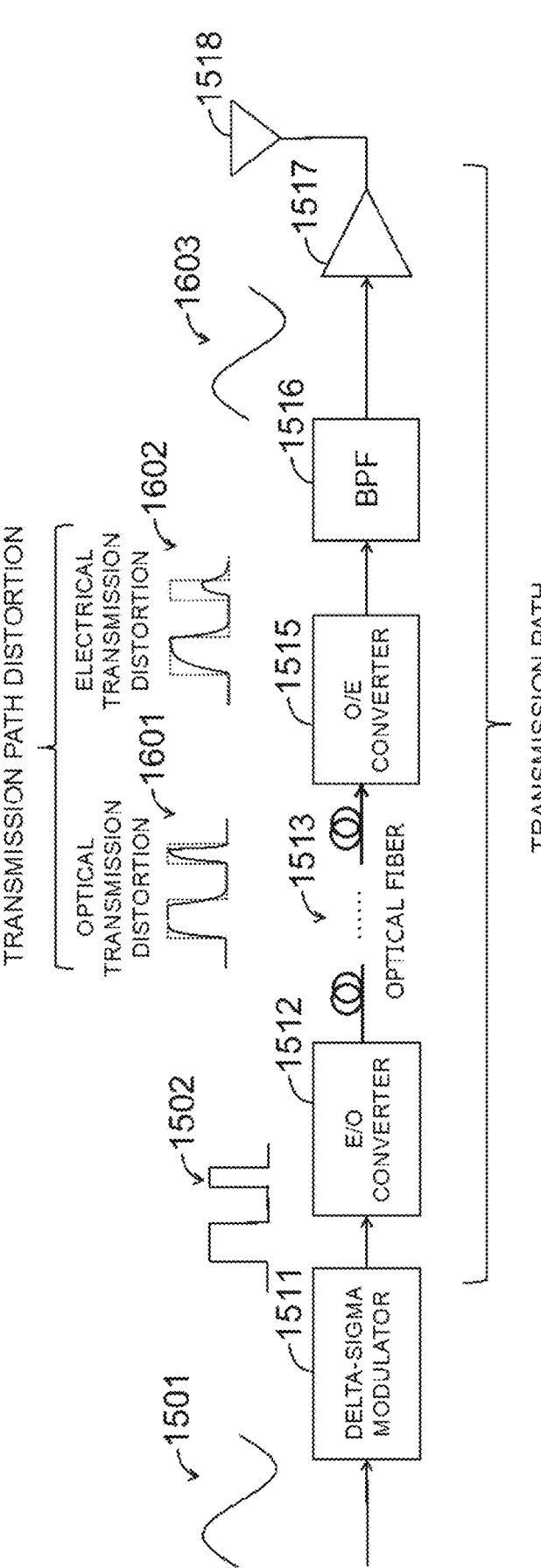
FIG. 16 is an example of a system using delta-sigma modulation and an RoF technology.

FIG. 16 is an example of a system using delta-sigma modulation and an RoF technology. A delta-sigma modulator 1511 converts an input signal 1501 into a quantized signal (pulse train) 1502. Note that the delta-sigma modulator 1511 has a one-input-one-output typical configuration of and the quantized signal is fed back inside the delta-sigma modulator 1511. An electric-optic converter (E/O converter) 1512 converts the pulse train 1502 into an optical signal 1601. The optical signal 1601 is transmitted on an optical fiber 1513. Then an Optic-Electric converter (O/E converter) 1515 converts the optical signal 1601 into an electrical signal 1602. A band-pass filter (BPF) 1516 converts the electrical signal 1602 into an original signal 1603 that is before the delta-sigma modulation. An amplifier 1517 amplifies the signal 1603. The amplified signal is output from an antenna 1518.

In this system, in a transmission path of the pulse train 1502, distortion is generated in the pulse train 1502. For example, distortion is generated when the optical signal 1601 passes through the optical fiber 1513. Such distortion is referred to as "optical transmission distortion". The optical signal 1601 expresses a state that the optical transmission distortion is generated.

Furthermore, large power reflection between the O/E converter 1515 and the BPF 1516 may cause distortion. Such distortion is referred to as "electrical transmission distortion". The electrical signal 1602 expresses a state that the electrical transmission distortion is generated. Hereinafter, the optical transmission distortion and the electrical transmission distortion are collectively referred to as "transmission path distortion".

The transmission path distortion results in affecting a frequency component of the signal 1603 output via the BPF 1516. Specifically, spectral leakage described above is caused. The signal to noise ratio (SN ratio) of the signal 1603 deteriorates. As described above, an issue is that the transmission path distortion causes the signal quality to be deteriorated. In view of the above, a configuration is required that allows the transmission path distortion to be suppressed.

(2) Technical Features

In the one or more example embodiments, a delta-sigma modulation apparatus is provided. The delta-sigma modulation apparatus includes: a delta-sigma modulator configured to perform delta-sigma modulation on a first signal as an input signal, and output a second signal; a leaner configured to learn a parameter for a transmission path distortion model including at least a mixture model and a filter structure, using the second signal and a third signal generated through a transmission path of the second signal; and a modeling processor configured to input the second signal to the transmission path distortion model, and output a fourth signal that is an approximated value of a signal which is generated through at least part of the transmission path of the second signal. The delta-sigma modulator is configured to perform the delta-sigma modulation on the first signal by using the fourth signal, and output the second signal.

In general, the configuration of one-input-one-output described in FIG. 16 (i.e., the delta-sigma modulator 1511 that a quantized signal is therein fed back directly) is referred to as delta-sigma modulation. In contrast, in the one or more example embodiments of the present disclosure, the second signal is not directly fed back as the fourth signal, but the second signal and the fourth signal are separated via the modeling processor. The delta-sigma modulator has a configuration in which the delta-sigma modulator receives two signals, namely the first signal and the fourth signal, as input signals and outputs the second signal, in other words, a two-input-one-output configuration. In the one or more example embodiments in the present disclosure, for convenience, such a two-input-one-output configuration is referred to as "delta-sigma modulation".

The delta-sigma modulation apparatus provided with the configuration described above allows transmission path distortion generated in the second signal in the transmission path of the second signal to be suppressed. The delta-sigma modulation apparatus reduces possibility of generation of spectral leakage, thereby allowing high quality signal transmission to be performed.

2. Example Embodiments

Next, description will be given of the one or more example embodiments and example alterations thereof, with reference to FIGS. 1 to 12.

<2-1. Schematic Configuration of Wireless Communication Apparatus>

Figure 1:
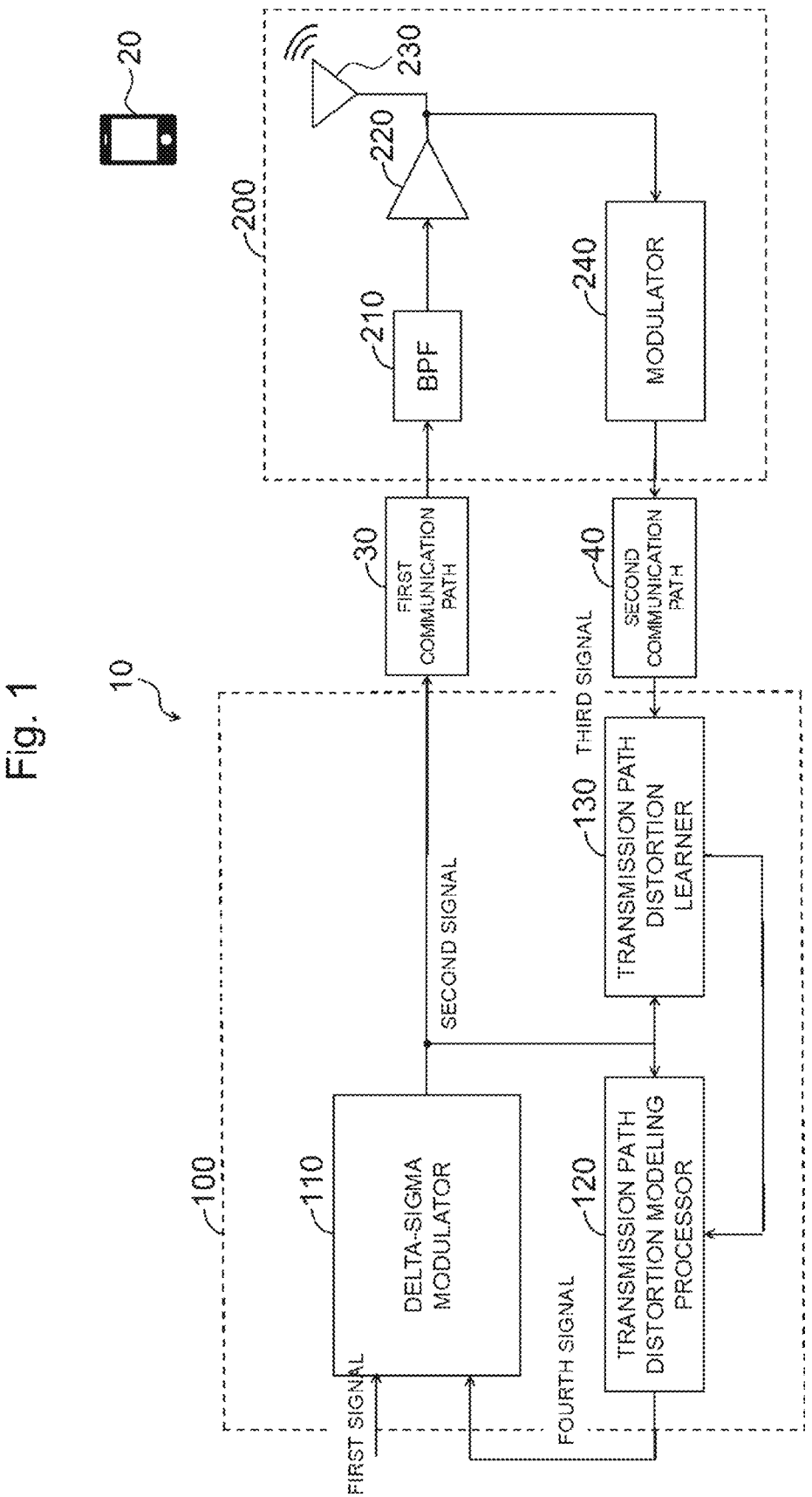
FIG. 1 is a diagram illustrating an example of a configuration of a wireless communication apparatus according to the present disclosure.

FIG. 1 is a diagram illustrating an example of a configuration of a wireless communication apparatus 10. The wireless communication apparatus 10 is an apparatus including an RoF technology/system. The wireless communication apparatus 10 may conform to a technical specification (for example, 5G, 5G advanced, 6G, or the like) defined by the Third Generation Partnership Project (3GPP). The wireless communication apparatus 10 is, of course, not limited to this example.

The wireless communication apparatus 10 includes a delta-sigma modulation apparatus 100 and an access point 200. The delta-sigma modulation apparatus 100 and the access point 200 are connected to each other via a first communication path 30. The delta-sigma modulation apparatus 100 transmits a signal to the access point 200 via the first communication path 30.

The access point 200 converts the signal into a radio signal and transmits the radio signal to a terminal apparatus 20. The access point 200 may be simply referred to as a "transmission apparatus" or a "transmitter".

Furthermore, the delta-sigma modulation apparatus 100 and the access point 200 are connected to each other via a second communication path 40. The access point 200 transmits a signal to the delta-sigma modulation apparatus 100 via the second communication path 40.

The delta-sigma modulation apparatus 100 includes a delta-sigma modulator 110, a transmission path distortion modeling processor 120, and a transmission path distortion learner 130. Hereinafter, for simplified indication, the transmission path distortion modeling processor 120 is simply referred to as a "modeling processor 120", and the transmission path distortion learner 130 is simply referred to as a "learner 130".

The delta-sigma modulator 110 performs delta-sigma modulation on a radio signal as an external input signal and outputs a quantized signal (one-bit pulse train). The quantized signal is transmitted to the access point 200 via the first communication path 30.

The first communication path 30 may include either one or both of an electrical transmission line (for example, metal line) that transmits an electrical signal and an optical transmission line (for example, optical fiber) that transmits an optical signal. In this example, the first communication path 30 includes an RoF system. For example, the first communication path 30 includes an E/O converter, an optical fiber, and an O/E converter. The first communication path 30 performs E/O conversion on a radio signal to output an optical signal, transmits the optical signal on the optical fiber, and performs O/E conversion on the optical signal to output an electrical signal. Note that, in a case where the first communication path 30 has a configuration including an electrical transmission line, the first communication path 30 transmits an electrical signal.

The access point 200 includes a band-pass filter (BPF) 210, an amplifier 220, an antenna 230, and a modulator 240. The BPF 210 performs, on a quantized signal, band-pass processing (hereinafter, referred to as "BPF processing") that causes only a desired frequency band to pass. The quantized signal is converted into a radio signal through the BPF 210. In other words, the quantized signal is restored to an original radio signal that is before the delta-sigma modulation. The amplifier 220 amplifies a radio signal. The antenna 230 outputs the amplified radio signal to a space. As described above, the access point 200 has a function of transmitting a radio signal toward the terminal apparatus 20.

Note that the amplified radio signal is also output to the modulator 240. The modulator 240 performs modulation processing on the radio signal and transmits the modulated radio signal to the learner 130 via the second communication path 40. As described above, the access point 200 also has a function of transmitting (i.e., feeding back), to the delta-sigma modulation apparatus 100, a signal generated through a transmission path of a quantized signal output by the delta-sigma modulation apparatus 100.

The second communication path 40 may include either one or both of an electrical transmission line (for example, metal line) that transmits an electrical signal and an optical transmission line (for example, optical fiber) that transmits an optical signal. In this example, the second communication path 40 includes an RoF system. For example, the second communication path 40 includes an E/O converter, an optical fiber, and an O/E converter. The second communication path 40 performs E/O conversion on an electrical signal to output an optical signal, transmits the optical signal on the optical fiber, and performs O/E conversion on the optical signal to restore the optical signal to an electrical signal. Note that, in a case where the second communication path 40 has a configuration including an electrical transmission line, the second communication path 40 transmits an electrical signal.

Hereinafter, a radio signal input to the delta-sigma modulator 110 is referred to as a "first signal". Furthermore, a quantized signal output by the delta-sigma modulator 110 is referred to as a "second signal". Moreover, a signal that is generated through a transmission path of the second signal and that is fed back to the learner 130 is referred to as a "third signal". In other words, the third signal is a signal generated in a process where the second signal is transmitted on the transmission path. The third signal may include information on transmission path distortion generated in the transmission path of the second signal. Therefore, the third signal is used to feed back the information on the transmission path distortion generated in the transmission path of the second signal.

The modeling processor 120 includes a transmission path distortion model that operates in accordance with a certain parameter. The transmission path distortion model is a model that outputs an approximated value of a signal generated through at least part of the transmission path of the second signal. For example, the transmission path distortion model outputs an approximated value (estimated value) of a signal generated in a process where the second signal passes the first communication path 30, the BPF 210, the amplifier 220, and the antenna 230.

Hereinafter, the transmission path distortion model included in the modeling processor 120 is referred to as a "first transmission path distortion model". A parameter for the first transmission path distortion model is referred to as a "first parameter".

The modeling processor 120 receives the second signal as an input signal. The modeling processor 120 inputs the second signal to the first transmission path distortion model and outputs an approximated value of a signal generated through at least part of the transmission path of the second signal. Hereinafter, such an approximated value is referred to as a "fourth signal". With use of the fourth signal, the modeling processor 120 can feed back, to the delta-sigma modulator 110, the information on the transmission path distortion generated in the transmission path of the second signal.

The learner 130 receives the second signal and the third signal as input signals. The learner 130 calculates the first parameter by using the second signal and the third signal. The learner 130 transmits the first parameter calculated, to the modeling processor 120. Note that the first parameter can be learned by using a method described in NPL 4, for example.

The delta-sigma modulator 110 receives the first signal and the fourth signal as input signals. The delta-sigma modulator 110 performs delta-sigma modulation on the first signal by using the fourth signal, and outputs the second signal.

As described above, the delta-sigma modulator 110 has a configuration in which the delta-sigma modulator 110 receives two signals, namely the first signal and the fourth signal, as input signals and outputs the second signal, in other words, a two-input-one-output configuration. The second signal and the fourth signal are separated by the modeling processor 120 interposed therebetween. The modeling processor 120 is in charge of a feedback function. The one or more example embodiments of the present disclosure have a feature in that the first parameter in the modeling processor 120 is updated by the learner 130.

Figure 2:
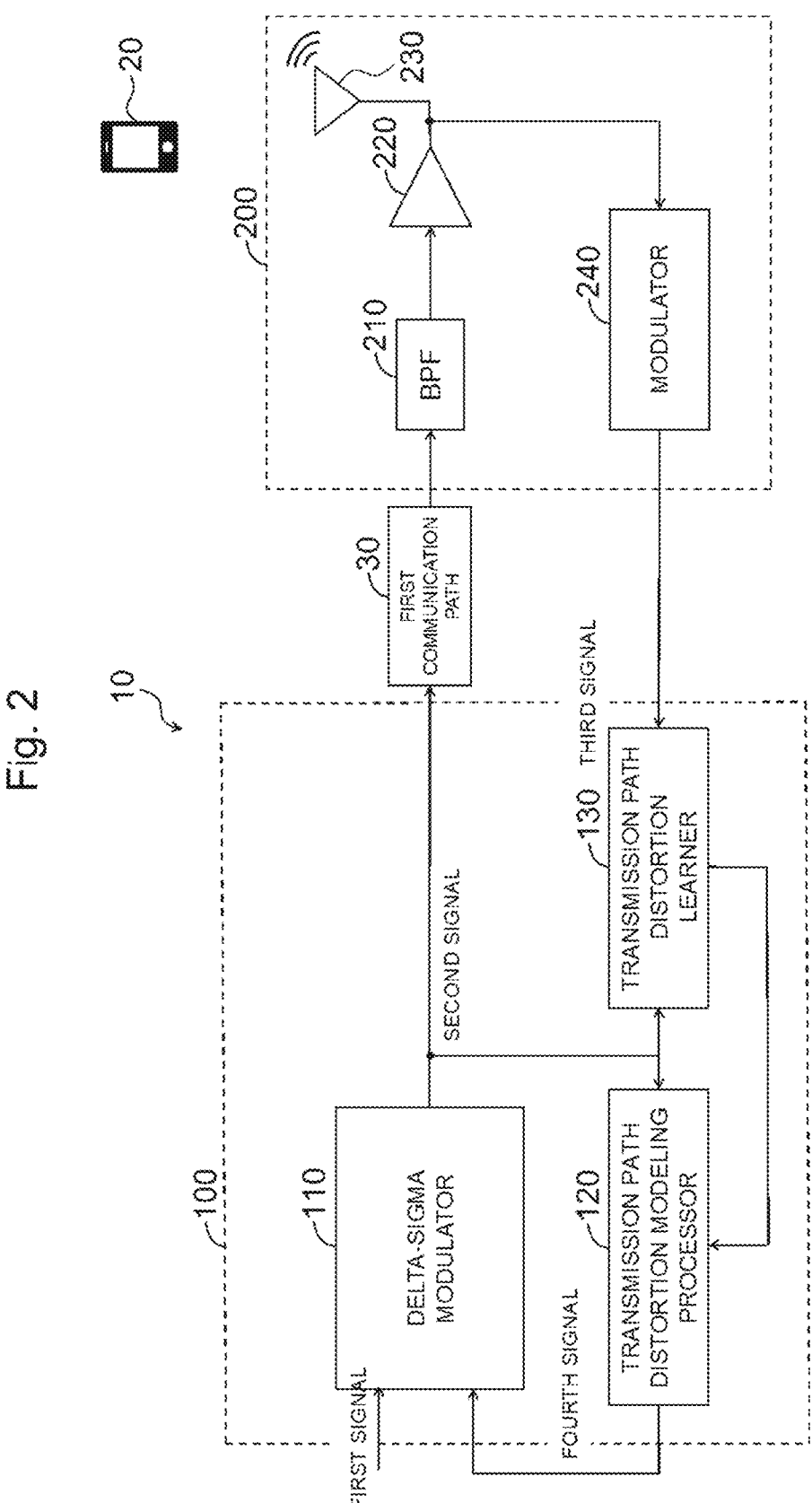
FIG. 2 is a diagram illustrating another example of the configuration of the wireless communication apparatus according to the present disclosure.

FIG. 2 is a diagram illustrating another example of the configuration of the wireless communication apparatus 10. As illustrated in FIG. 2, the second communication path 40 may be omitted. In other words, the modulator 240 and the learner 130 may be connected to each other directly.

<2-2. Configuration of Delta-Sigma Modulator>

As types of devices for implementation of the delta-sigma modulator 110, there exist two types, namely band-pass type (see NPL 1) and low-pass type (see NPL 2). The delta-sigma modulator 110 in FIG. 1 is of low-pass type and implemented with reference to NPL 3.

Figure 3:
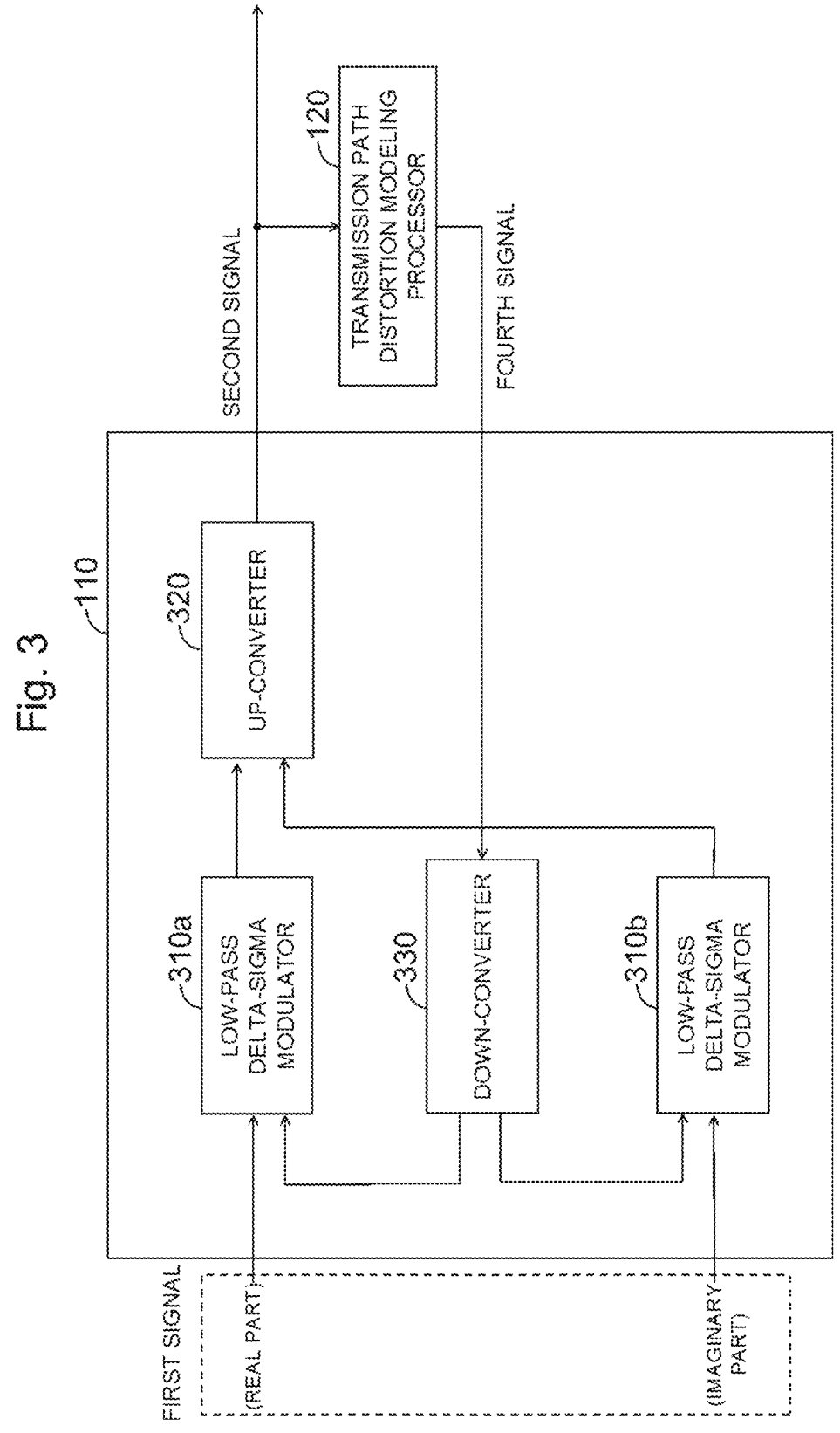
FIG. 3 is a diagram illustrating an example of a configuration of a delta-sigma modulator according to the present disclosure.

FIG. 3 is a diagram illustrating an example of a configuration of the delta-sigma modulator 110. The delta-sigma modulator 110 includes a low-pass delta-sigma modulators 310*a* and 310*b*, an up-converter 320, and a down-converter 330.

An input signal (i.e., first signal) to the delta-sigma modulator 110 is a radio signal expressed with a complex number. The real part and imaginary part of the first signal are each expressed with digital data having a multi-bit width. The data of the real part of the first signal is input to the low-pass delta-sigma modulator 310*a*. The data of the imaginary part of the first signal is input to the low-pass delta-sigma modulator 310*b*.

The low-pass delta-sigma modulator 310*a* performs delta-sigma modulation on the data of the real part of the first signal to convert the data of the real part into a bit string of one bit. The low-pass delta-sigma modulator 310*a* outputs the bit string as an output signal to the up-converter 320.

The low-pass delta-sigma modulator 310*b* performs delta-sigma modulation on the data of the imaginary part of the first signal to convert the data of the imaginary part into a bit string of one bit. The low-pass delta-sigma modulator 310*b* outputs the bit string as an output signal to the up-converter 320.

The low-pass delta-sigma modulators 310*a* and 310*b* perform typical low-pass delta-sigma modulation. For example, as described in NPLs 2 and 3, high order low-pass delta-sigma modulation may be used as the low-pass delta-sigma modulators 310*a* and 310*b*.

The up-converter 320 up-converts an output signal of the low-pass delta-sigma modulator 310*a* and an output signal of the low-pass delta-sigma modulator 310*b* into a desired frequency (target frequency) f0. An output signal of the up-converter 320 is a signal obtained by shifting, by a certain frequency Δfc, a signal having the output signal of the low-pass delta-sigma modulator 310*a* as the real part and having the output signal of the low-pass delta-sigma modulator 310*b* as the imaginary part.

Note that, in a case that a sampling rate of a signal is set as ¼ times of the desired frequency f0, in other words, f0/4, a signal string of cos ωt being a local signal used for up-conversion is [1, 0, −1, 0, 1, . . . ], and a signal string of −sin ωt [0, −1, 0, 1, 0, . . . ]. Here, the symbol "/" represents division. "cos( )" represents a cosine function and "sin( )" represents a sine function (hereinafter, this applies the same). Furthermore, ω=2×π×f0. With this, processing of outputting a signal of the real part and processing of outputting a signal of the imaginary part are simplified. Furthermore, output signals of the low-pass delta-sigma modulators 310*a* and 310*b* are each a binarized signal string (i.e., either 1 or −1). Therefore, a value obtained by multiplying one of the output signals by the local signal cos ωt, multiplying the other one of the output signals by the local signal −sin ωt, and then adding them together is also a binarized signal string. In other words, quantization of a signal is not damaged by processing of the up-converter 320. The one or more example embodiments of the present disclosure may include such processing.

The modeling processor 120 estimates a transmission path distortion amount that a signal (i.e., second signal) output by the up-converter 320 is to have. For example, the transmission path distortion amount estimated here may be a value expressing transmission path distortion to have in a process where the second signal passes the first communication path 30, the BPF 210, the amplifier 220, and the antenna 230. The modeling processor 120 applies the transmission path distortion amount such estimated, to the second signal and thereby outputs the fourth signal. As described above, the modeling processor 120 includes the first transmission path distortion model. In other words, in the modeling processor 120, transmission path distortion for the second signal to have in the transmission path until the antenna 230 is modeled. The modeling processor 120 functions as a filter having a coefficient being a real number or a complex number.

The fourth signal is input to the low-pass delta-sigma modulators 310*a* and 310*b* as a feedback signal, via the down-converter 330. Specifically, the down-converter 330 down-converts the fourth signal into an in-phase component signal (hereinafter, referred to as "I signal") in baseband and an orthogonal component signal (hereinafter, referred to as "Q signal"). The down-converter 330 outputs the I signal to the low-pass delta-sigma modulator 310*a* as a feedback signal. The down-converter 330 outputs the Q signal to the low-pass delta-sigma modulator 310*b* as a feedback signal.

The low-pass delta-sigma modulator 310*a* performs delta-sigma modulation on the first signal (the data of the real part) by using the feedback signal from the down-converter 330. The low-pass delta-sigma modulator 310*b* performs delta-sigma modulation on the first signal (the data of the imaginary part) by using the feedback signal from the down-converter 330.

<2-3. Configuration of Modeling Processor>

Figure 4:
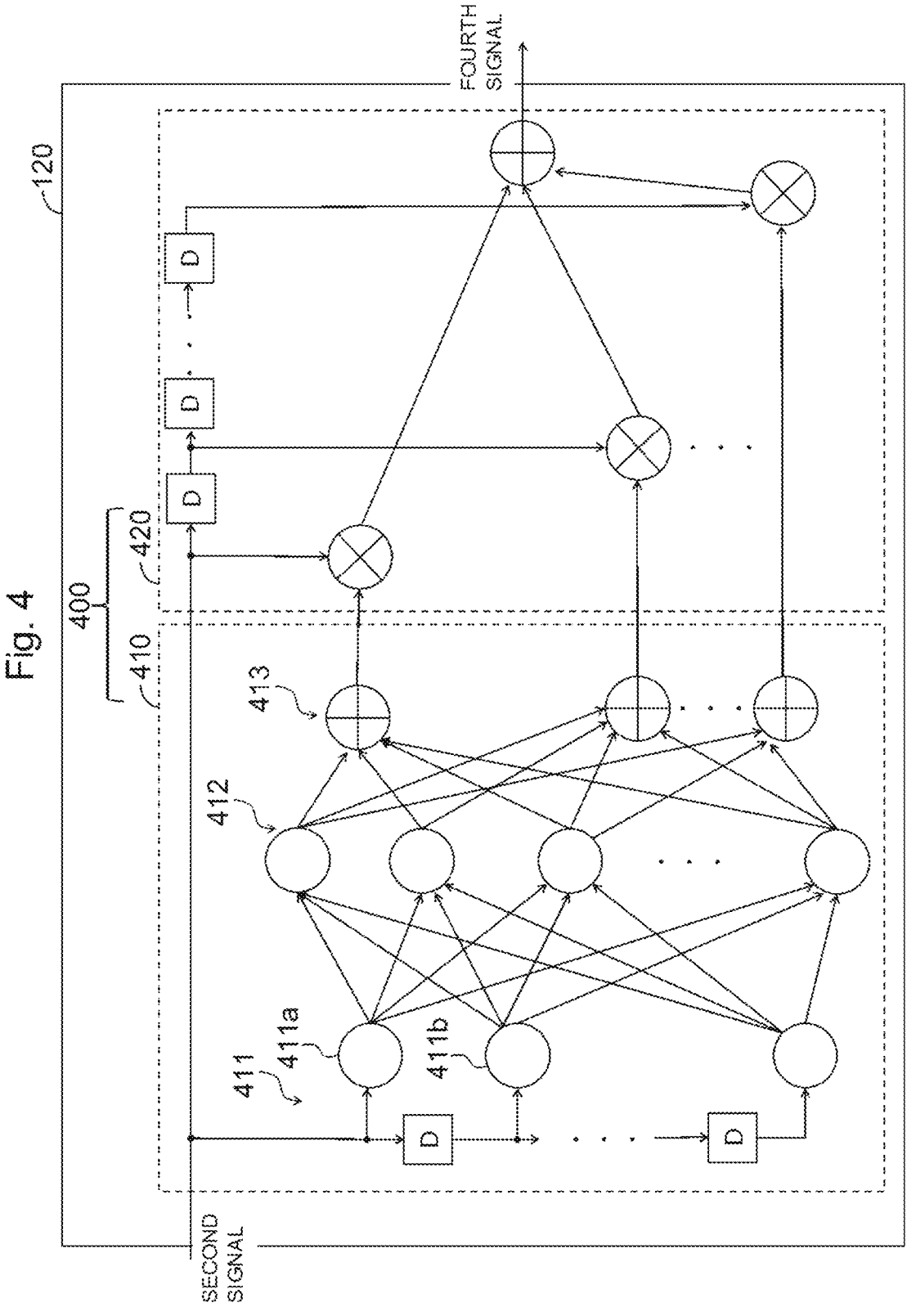
FIG. 4 is a diagram illustrating an example of a configuration of a transmission path distortion modeling processor according to the present disclosure.

FIG. 4 is a diagram illustrating an example of a configuration of the modeling processor 120. The modeling processor 120 includes a first transmission path distortion model 400. The first transmission path distortion model 400 includes a signal string mixture model 410 and a filter structure 420.

The signal string mixture model 410 includes a neural network. The signal string mixture model 410 operates in accordance with the first parameter. The first parameter may include a weight and a bias, for example. For example, assuming that a function f in the following expression (1) is an activation function in the neural network, x is an input, w is a weight, and b is a bias.

$$f(wx + b) \tag{1}$$

The neural network includes an input layer 411, an intermediate layer 412, and an output layer 413. The input layer 411 includes a node 411*a* to which a current value of the second signal is input. Further, the input layer 411 further includes a node 411*b* to which a past value of the second signal is input. Note that "D" represents a delay. The output layer 413 includes a node that outputs a sum of outputs from a plurality of nodes in the intermediate layer 412.

The neural network performs mixing on a value of the input layer 411 and outputs, from the output layer 413, a coefficient string to be used as a filter coefficient of the filter structure 420.

The filter structure 420 applies a coefficient string being an output string of the signal string mixture model 410 to respective signal strings of the second signal. Specifically, the filter structure 420 multiplies each of the signal strings of the second signal by the coefficient string. Then the filter structure 420 adds the multiplied results together to output the fourth signal. With this filtering processing, an output that distortion generated in the transmission path of the second signal is modeled can be obtained.

Note that various neural networks used in general may be applied to the one or more example embodiments. For example, the intermediate layer 412 may include a plurality of layers. In other words, as the signal string mixture model 410, a multi-layer neural network may be used. As a weight for the neural network, a complex number may be used. In this configuration, the modeling processor 120 may down-convert an output signal of the filter structure 420 for conversion into a complex baseband signal. In this example, although the signal string mixture model 410 is assumed to have a structure of neural network, the structure is not limited to this and may be any structure as long as the signal string mixture model 410 is a model capable of estimating transmission path distortion for the second signal to have.

<2-4. Configuration of Learner>

Figure 5:
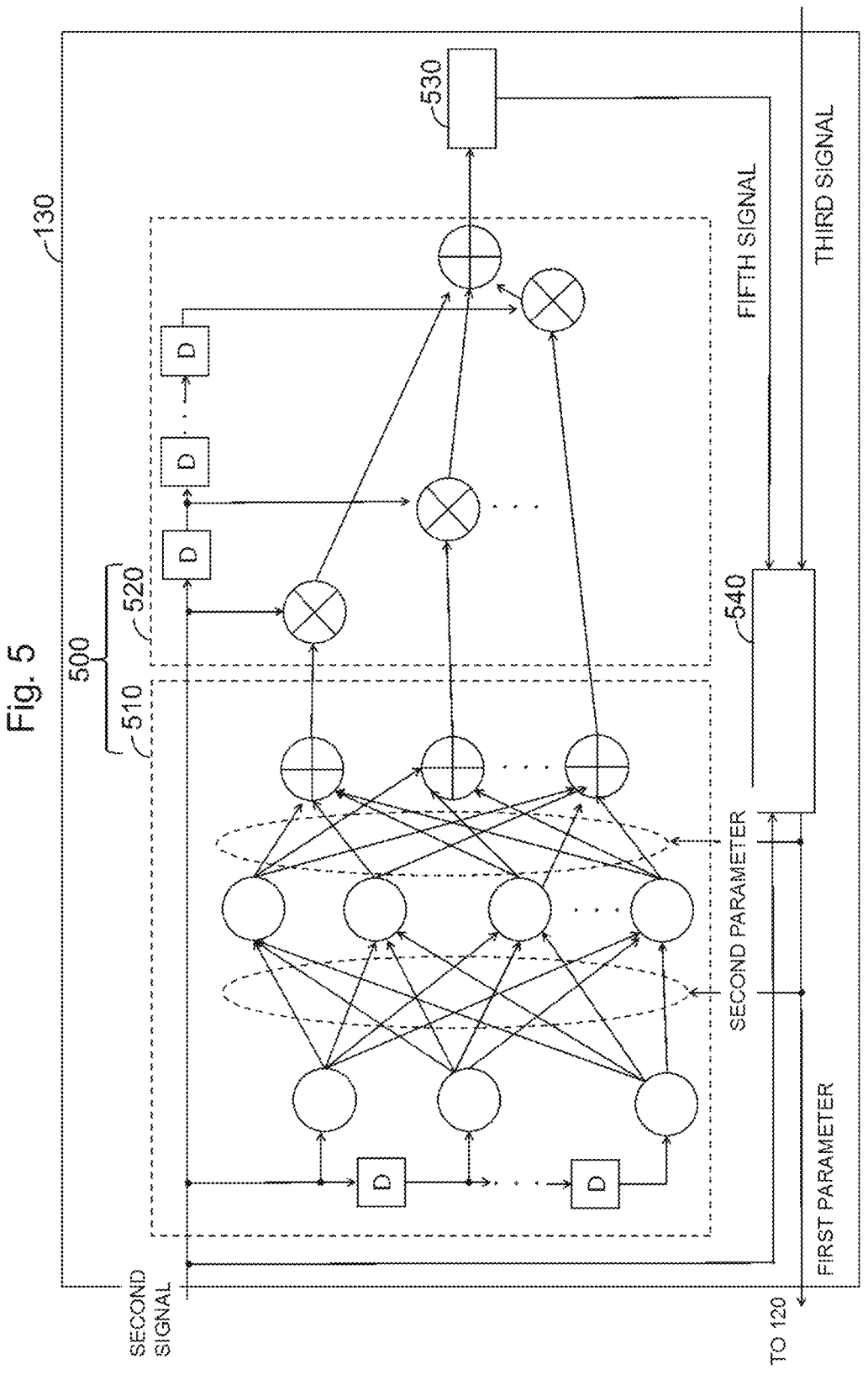
FIG. 5 is a diagram illustrating an example of a configuration of a transmission path distortion learner according to the present disclosure.

FIG. 5 is a diagram illustrating an example of a configuration of the learner 130. The learner 130 includes a transmission path distortion model 500, a processor 530, and an error propagation learner 540. Hereinafter, the transmission path distortion model 500 is referred to as a "second transmission path distortion model 500", for distinguishing from the first transmission path distortion model 400. A parameter for the second transmission path distortion model 500 is referred to as a "second parameter".

The second transmission path distortion model 500 is a model simulating the first transmission path distortion model 400. The second transmission path distortion model 500 includes a signal string mixture model 510 and a filter structure 520. The signal string mixture model 510 is a neural network similar to that of the signal string mixture model 410. The signal string mixture model 510 operates in accordance with the second parameter. The second parameter may include a weight and a bias, for example. The filter structure 520 has a structure similar to that of the filter structure 420.

The processor 530 receives an output signal of the second transmission path distortion model 500 as an input signal, and, on the input signal, performs BPF processing and performs modulation processing. The processor 530 performs processing similar to that of the BPF 210 on the input signal and performs processing similar to that of the modulator 240. As described above, it can be said that the second transmission path distortion model 500 and the processor 530 are a model simulating the transmission path of the second signal.

Thus, the learner 130 can generate a signal under a condition similar to that for the third signal generated in a process where the second signal passes the BPF 210, the modulator 240, and the like via the first communication path 30. Hereinafter, an output signal of the processor 530 is referred to as a "fifth signal".

The error propagation learner 540 receives the third signal and the fifth signal as input signals. The error propagation learner 540 can compare the third signal and the fifth signal to learn the second parameter. Specifically, for learning of the second parameter, error propagation learning used in general in a neural network is used.

For a signal string of the fifth signal, $Y=[y\_{n}, y\_{n-1}, y\_{n-2}, \ldots ]$ is assumed. For a signal string of the third signal, $Z=[z\_{n}, z\_{n-1}, z\_{n-2}, \ldots ]$ is assumed. In this case, the error propagation learner 540 may learn the second parameter, based on an error norm represented by the following expression (2).

$$|Y - Z| \tag{2}$$

In other words, the error propagation learner 540 applies an error propagation method to minimize expression (2). With this, the error propagation learner 540 learns the second parameter. Note that "$\| \; \|$" represents a norm of a vector and includes one or more of norms such as L0, L1, and L2. Here, L0 norm represents the number of dimensional elements having a value other than zero, L1 norm represents the sum of absolute values of the respective dimensional elements (i.e., Manhattan distance), and L2 norm represents the square root of the sum of squares of values of the respective dimensional elements (i.e., Euclidean distance).

The error propagation learner 540 applies the second parameter to the second transmission path distortion model 500. In other words, the error propagation learner 540 updates the second parameter for the second transmission path distortion model 500 to the second parameter calculated by the error propagation learner 540. The error propagation learner 540 outputs the second parameter to the modeling processor 120 as the first parameter.

The modeling processor 120 receives the first parameter from the learner 130. The modeling processor 120 updates the first parameter for the first transmission path distortion model 400 to the received first parameter (i.e., first parameter calculated by the error propagation learner 540).

<2-5. Process Flow of Delta-Sigma Modulation Apparatus>

Next, a process flow of the delta-sigma modulation apparatus 100 will be described with reference to FIG. 6. FIG. 6 is a flowchart illustrating an example of a process flow of the delta-sigma modulation apparatus 100.

When the wireless communication apparatus 10 is turned on (or the wireless communication apparatus 10 is reset), the delta-sigma modulator 110 performs delta-sigma modulation on the first signal as an external input signal and outputs the second signal (601).

The learner 130 calculates the second parameter by using the second signal and the third signal (602).

The learner 130 updates the second parameter for the second transmission path distortion model 500 to the second parameter such calculated (603). Furthermore, the learner 130 transmits the second parameter as the first parameter to the modeling processor 120. The modeling processor 120 receives the first parameter from the learner 130. The modeling processor 120 updates the first parameter for the first transmission path distortion model 400 to the first parameter such received (603).

The modeling processor 120 inputs the second signal to the first transmission path distortion model 400 and outputs the fourth signal (604).

The delta-sigma modulator 110 performs delta-sigma modulation on the first signal by using the fourth signal, and outputs the second signal (605).

Thereafter, the delta-sigma modulation apparatus 100 repeatedly performs processing of step 602 to step 605.

The configuration described above provides the following effects. The delta-sigma modulation apparatus 100 receives, as the third signal fed back, information related to transmission path distortion generated in the transmission path of the second signal. The delta-sigma modulation apparatus 100 generates the fifth signal from the second signal and compares the third signal and the fifth signal. The delta-sigma modulation apparatus 100 calculates the second parameter (=first parameter), based on error propagation between the third signal and the fifth signal. The delta-sigma modulation apparatus 100 updates the first parameter for the first transmission path distortion model 400 to the first parameter such calculated and updates the second parameter for the second transmission path distortion model 500 to the second parameter such calculated. With this, information on transmission path distortion generated in the transmission path of the second signal is reflected to the first transmission path distortion model 400 and the second transmission path distortion model 500. The delta-sigma modulation apparatus 100 performs delta-sigma modulation on the first signal by using the fourth signal (output of the modeling processor 120). With this, the delta-sigma modulation apparatus 100 causes a signal component of target frequency f0 to pass, allowing noise shaping that causes surrounding noises of frequency f0 to move out of the band.

The feedback processing as described above allows the delta-sigma modulation apparatus 100 to suppress transmission path distortion generated in the transmission path of the second signal. This allows the delta-sigma modulation apparatus 100 to suppress spectral leakage. The delta-sigma modulation apparatus 100 is possible to perform high quality signal transmission.

<2-6. Example Alteration of Delta-Sigma Modulator>

Figure 7:
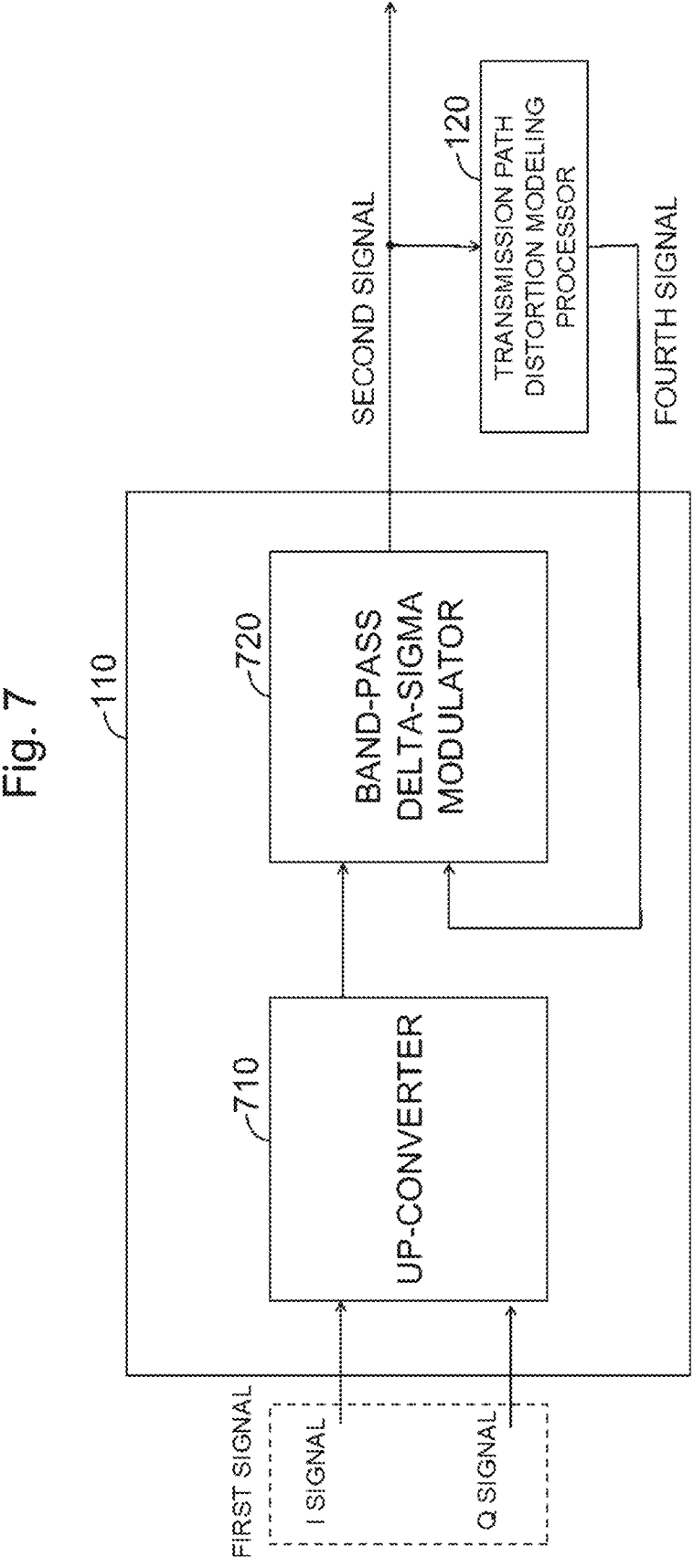
FIG. 7 is a diagram illustrating an example of the configuration of the delta-sigma modulator according to the present disclosure.

FIG. 7 is a diagram illustrating an example of a configuration of the delta-sigma modulator 110. The delta-sigma modulator 110 in FIG. 7 is of band-pass type and implemented with reference to NPL 1.

The delta-sigma modulator 110 includes an up-converter 710 and a band-pass delta-sigma modulator 720. The up-converter 710 is a component of two-input-one-output. The up-converter 710 receives an I signal and a Q signal as input signals (i.e., first signals). The up-converter 710 up-converts the I signal and the Q signal into a desired frequency f0.

The band-pass delta-sigma modulator 720 converts a signal output from the up-converter 710 into a bit string of one bit with a desired frequency component maintained, by using delta-sigma modulation having a filter design that suppresses quantized noise of the desired frequency f0. The band-pass delta-sigma modulator 720 may calculate or update the filter design by using the fourth signal. For a specific configuration of the band-pass delta-sigma modulator 720, high order delta-sigma modulation as described in NPL 1 may be used.

<2-7. Example Alteration of Transmission Path Distortion Model>

As described above, the modeling processor 120 includes a neural network. In general, the operation amount of a neural network is large. Thus, a combination of the delta-sigma modulator 110 and the modeling processor 120 may cause an operating frequency to be lowered. In order to have the operating frequency of the delta-sigma modulator 110 kept high, a configuration may be used that reduces the operation amount of the modeling processor 120.

Figure 8:
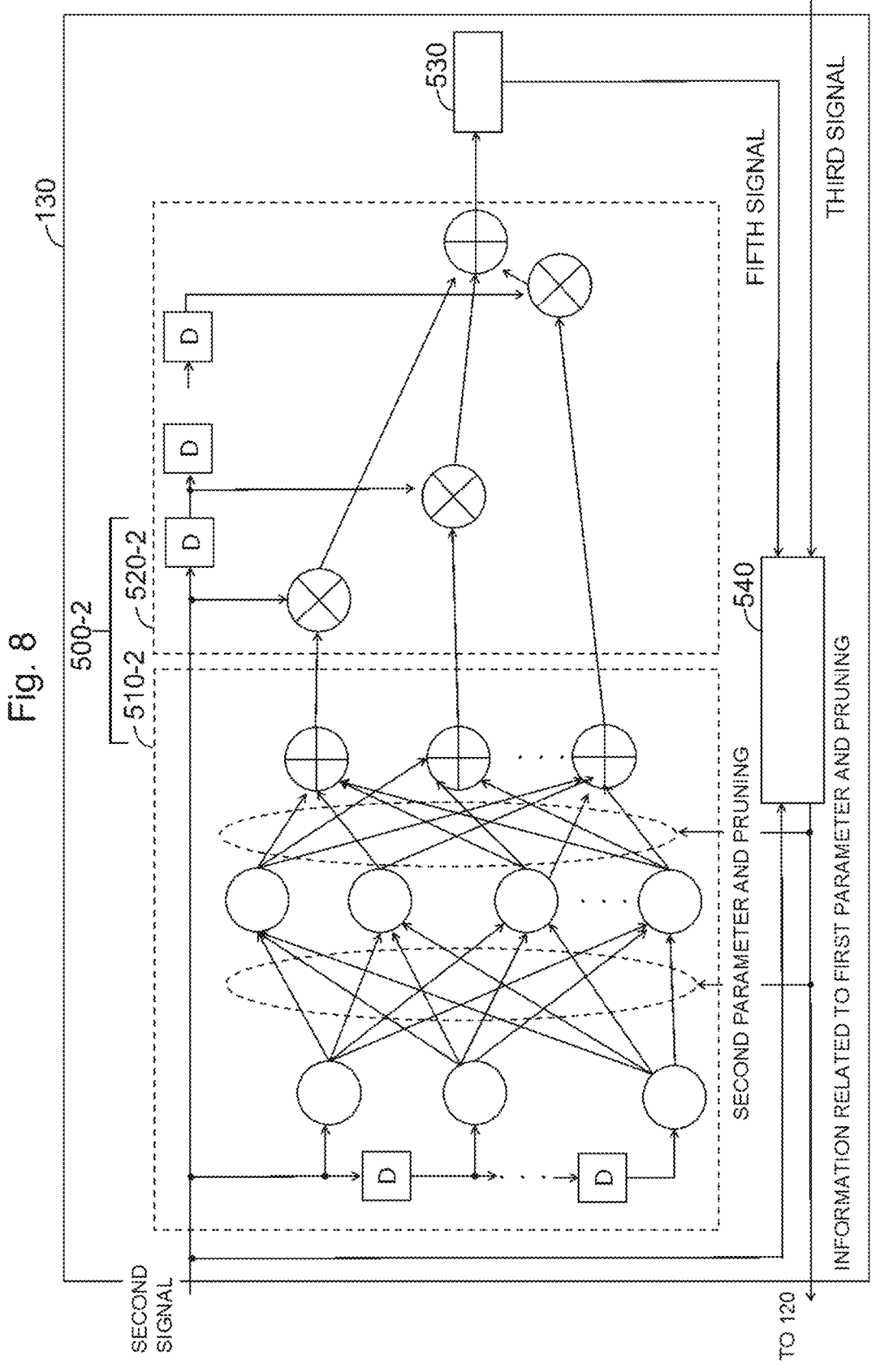
FIG. 8 is a diagram illustrating an example of the configuration of the transmission path distortion learner according to the present disclosure.

FIG. 8 is a diagram illustrating an example of a configuration of the learner 130. The learner 130 includes a second transmission path distortion model 500-2. The second transmission path distortion model 500-2 has a configuration different from the configuration of the second transmission path distortion model 500 in FIG. 5.

The second transmission path distortion model 500-2 includes a signal string mixture model 510-2 and a filter structure 520-2. A neural network included in the signal string mixture model 510-2 has the operation amount reduced by a technique of pruning. The pruning is processing that prunes one with little relation (for example, one with light weight) in the network of the neural network to reduce the calculating amount. Note that part of operations in the filter structure 520-2 may be omitted. Thus, the second transmission path distortion model 500-2 may be configured such that part of operations included in the signal string mixture model 510-2 and the filter structure 520-2 is reduced. The error propagation learner 540 determines, based on the learning result, what operation of the operations included in the signal string mixture model 510-2 and the filter structure 520-2 is to be reduced.

The signal string mixture model 510-2 has a structure similar to that of the signal string mixture model 510 in FIG. 5, but is different from the signal string mixture model 510 in the following. The signal string mixture model 510-2 is configured such that part of weights and/or biases of the signal string mixture model 510 is deleted. In other words, the operation amount of the signal string mixture model 510-2 is small as compared to the operation amount of the signal string mixture model 510.

The filter structure 520-2 has a structure similar to that of the filter structure 520 in FIG. 5, but is different from the filter structure 520 in the following. For example, with reduction in the operation amount of the signal string mixture model 510-2, part of connections from the signal string mixture model 510-2 is deleted. In other words, the operation amount of the filter structure 520-2 is small as compared to the operation amount of the filter structure 520.

The processor 530 receives an output signal of the second transmission path distortion model 500-2 as an input signal, and, on the input signal, performs BPF processing and performs modulation processing. The processor 530 performs processing similar to that of the BPF 210 on the input signal and performs processing similar to that of the modulator 240. Similarly to the above, an output signal of the processor 530 is referred to as the "fifth signal".

The learner 130 compares the third signal and the fifth signal to learn the second parameter, and determines deletion of part of the connections of the signal string mixture model 510-2. For learning of the second parameter, error propagation learning used in general in a neural network is used. Furthermore, methods of effectively deleting a connection in the signal string mixture model 510-2 include learning using a regularization term described in NPL 5.

For a signal string of the fifth signal, $Y=[y_{n}, y_{n-1}, y_{n-2}, \ldots]$ is assumed. For a signal string of the third signal, $Z=[z_{n}, z_{n-1}, z_{n-2}, \ldots]$ is assumed. Furthermore, for a weight vector of the signal string mixture model 510-2, $W=[w^{(1)}_{1, 1}, w^{(1)}_{1, 2}, \ldots, w^{(2)}_{N, M}]$ is assumed. The error propagation learner 540 may learn the second parameter, based on the following expression (3) in which a regularization term $\alpha\|W\|$ is added to an error norm $\|Y-Z\|$.

$$\|Y - Z\| + \alpha\|W\| \tag{3}$$

In other words, the error propagation learner 540 applies an error propagation method to minimize expression (3). With this, the error propagation learner 540 learns the second parameter and performs suppression of a weight having a small value in the signal string mixture model 510-2. For the weight such suppressed, the error propagation learner 540 deletes a connection having a weight equal to or smaller than a threshold $w_{th}$. With repeating processing of reducing connections as described above and processing of re-learning the second parameter, the error propagation learner 540 can perform, at the same time, determination of a weight to be deleted and learning of a weight remained, efficiently.

Note that methods of deleting a connection in the signal string mixture model 510-2 are not limited to the method described in NPL 5. Another pruning method may be applied to the signal string mixture model 510-2.

The error propagation learner 540 applies the second parameter to the second transmission path distortion model 500 and performs pruning on the second transmission path distortion model 500. The error propagation learner 540 transmits the second parameter to the modeling processor 120 as the first parameter and transmits information related to the pruning to the modeling processor 120.

Figure 9:
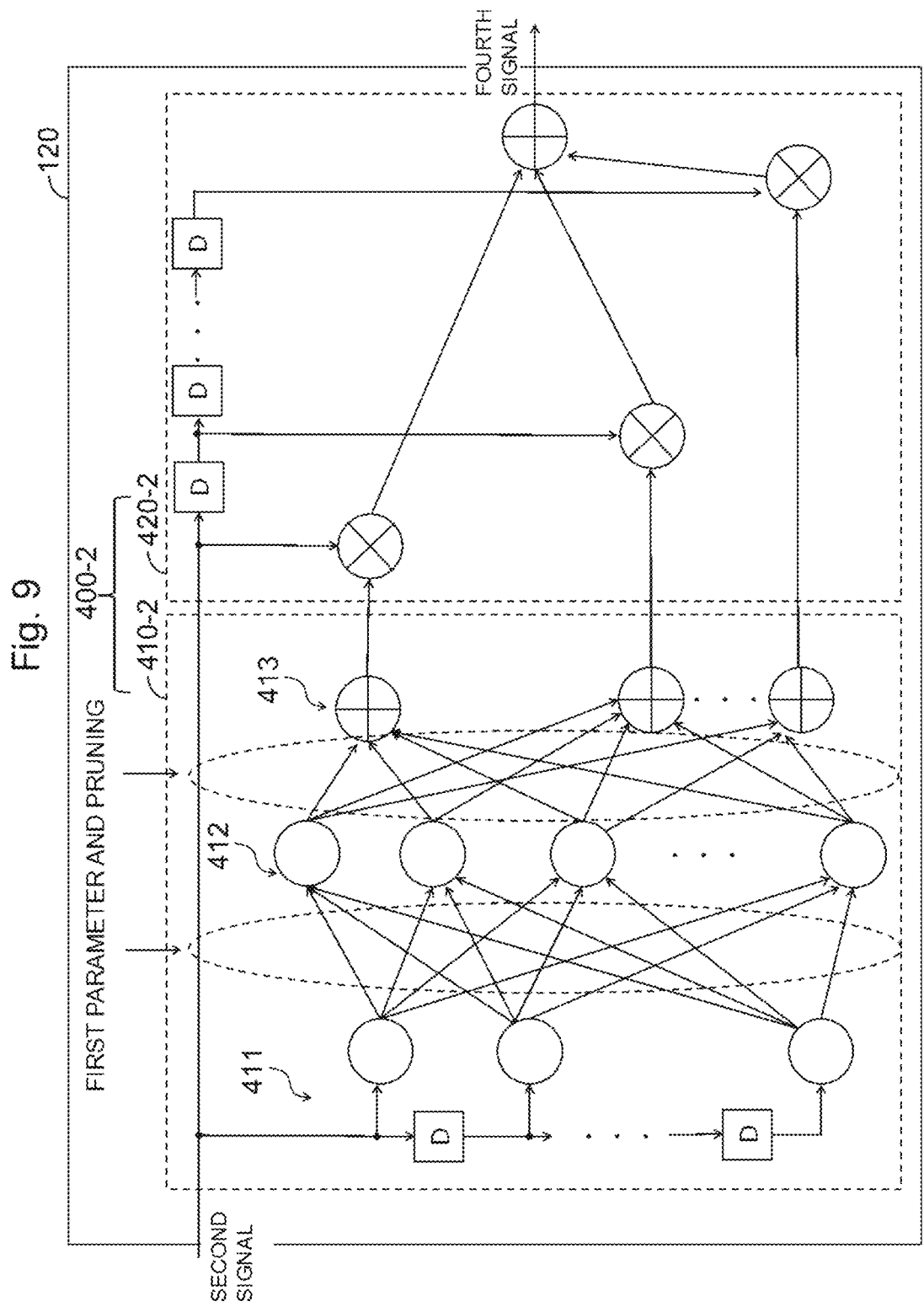
FIG. 9 is a diagram illustrating an example of the configuration of the transmission path distortion modeling processor according to the present disclosure.

FIG. 9 is a diagram illustrating an example of a configuration of the modeling processor 120. The modeling processor 120 includes a first transmission path distortion model 400-2. The first transmission path distortion model 400-2 includes a signal string mixture model 410-2 and a filter structure 420-2.

The modeling processor 120 receives the first parameter from the learner 130. The modeling processor 120 updates the first parameter for the first transmission path distortion model 400-2 to the received first parameter (i.e., first parameter calculated by the error propagation learner 540). The modeling processor 120 receives information related to the pruning from the learner 130. The modeling processor 120 performs, based on the information, pruning on the first transmission path distortion model 400-2. With this, the modeling processor 120 reduces part of operations in the signal string mixture model 410-2 and the filter structure 420-2.

As described above, in the first transmission path distortion model 400, in order to reduce the operation amount, the number of connections to be input to a neuron is reduced. At this time, a value of the input layer 411 in the signal string mixture model 410 is the second signal (pulse train) output through delta-sigma modulation, that is, binary. Here, it is assumed that the number of connections to be input to a neuron is reduced to one. In this case, an output of the signal string mixture model 410 is also binary. The signal string mixture model 410 is of binary-input-binary-output. Considering an activation function of a neuron, binary-input-binary-output is possible to be expressed either linearly or non-linearly, and thus non-linearity of the activation function is unnecessary. Thus, in a neural network with an intermediate layer omitted as well, it can be seen that similar modeling is possible.

Figure 10:
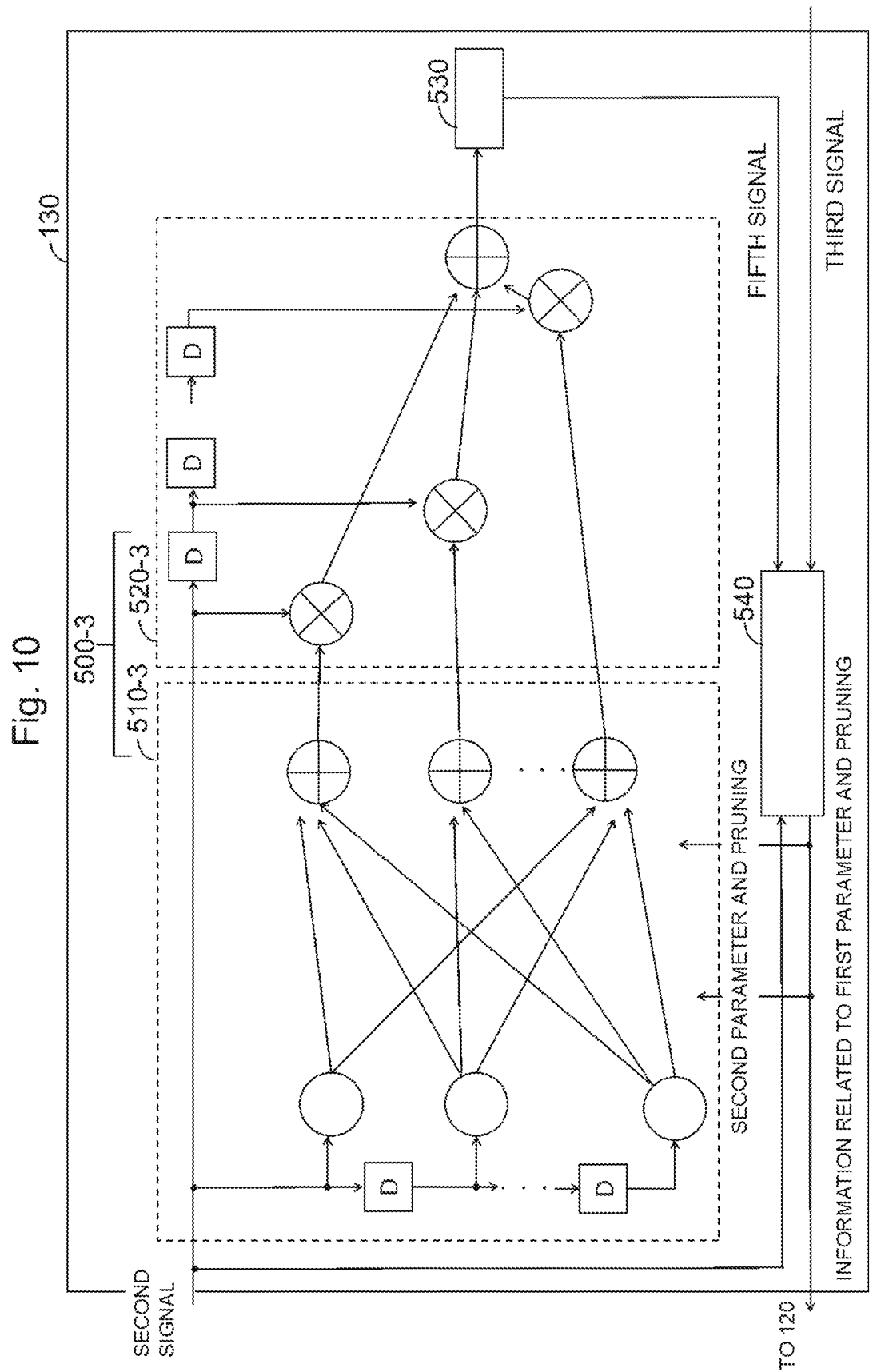
FIG. 10 is a diagram illustrating an example of the configuration of the transmission path distortion learner according to the present disclosure.

FIG. 10 is a diagram illustrating an example of a configuration of the learner 130. The learner 130 includes a second transmission path distortion model 500-3. The second transmission path distortion model 500-3 has a configuration different from the configuration of the second transmission path distortion model 500-2 in FIG. 8.

The second transmission path distortion model 500-3 includes a signal string mixture model 510-3 and a filter structure 520-3. The signal string mixture model 510-3 includes a neural network with no intermediate layer. Note that part of operations in the filter structure 520-3 may be omitted.

The processor 530 performs processing similar to that of the BPF 210 on an input signal and performs processing similar to that of the modulator 240. The error propagation learner 540 performs learning similarly to the above. Then, the error propagation learner 540 applies the second parameter to the second transmission path distortion model 500-3 and performs pruning on the second transmission path distortion model 500-3. The error propagation learner 540 transmits the second parameter to the modeling processor 120 as the first parameter and transmits information related to the pruning to the modeling processor 120.

Figure 11:
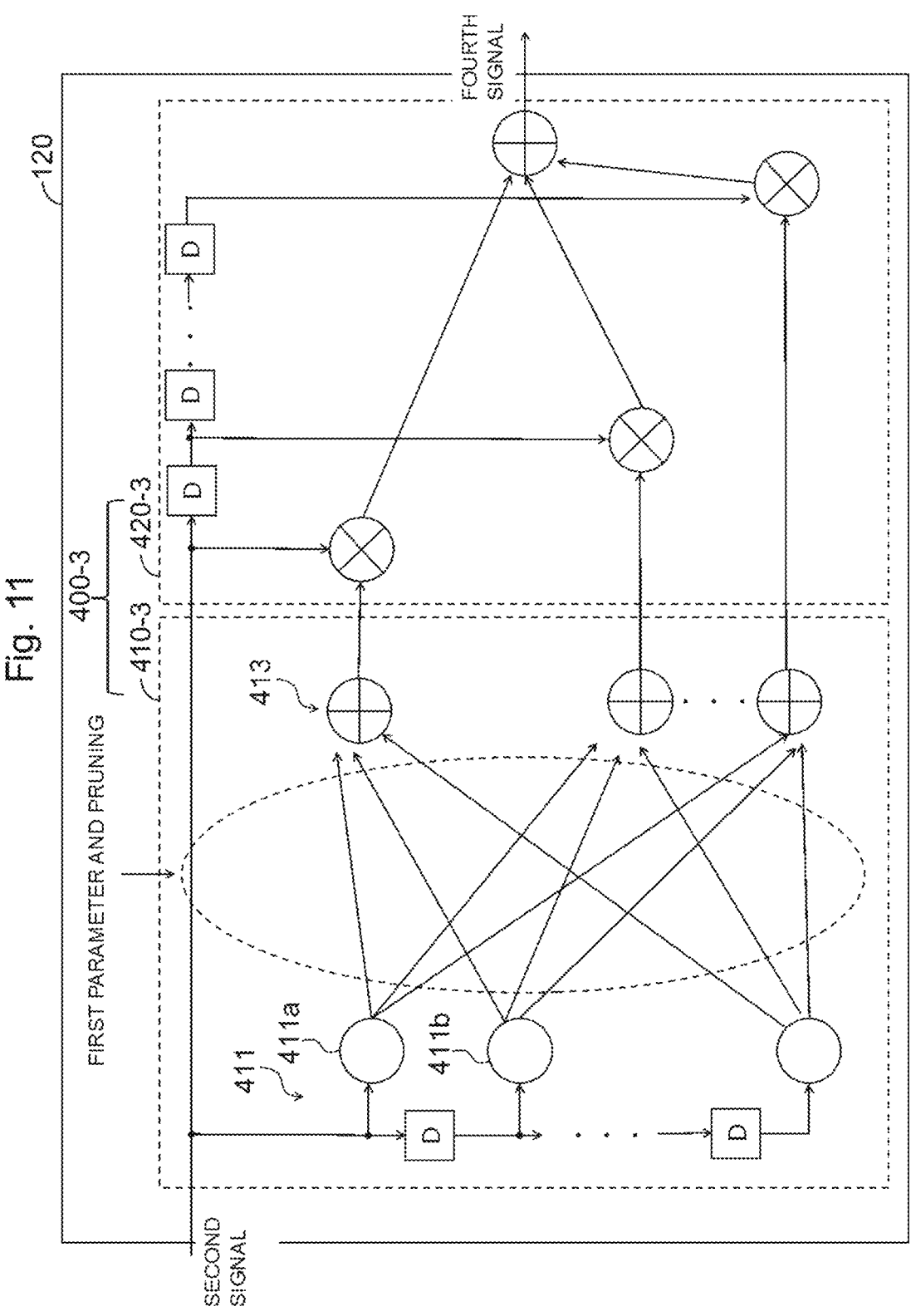
FIG. 11 is a diagram illustrating an example of the configuration of the transmission path distortion modeling processor according to the present disclosure.

FIG. 11 is a diagram illustrating an example of a configuration of the modeling processor 120. The modeling processor 120 includes a first transmission path distortion model 400-3. The first transmission path distortion model 400-3 includes a signal string mixture model 410-3 and a filter structure 420-3. The signal string mixture model 410-3 includes a neural network with no intermediate layer, similarly to the signal string mixture model 510-3 in FIG. 9. Note that part of operations in the filter structure 420-3 may be omitted.

The modeling processor 120 receives the first parameter from the learner 130. The modeling processor 120 updates the first parameter for the first transmission path distortion model 400-3 to the received first parameter (i.e., first parameter calculated by the error propagation learner 540). The modeling processor 120 receives information related to the pruning from the learner 130. The modeling processor 120 performs, based on the information, pruning on the first transmission path distortion model 400-3. With this, the modeling processor 120 reduces part of operations in the signal string mixture model 410-3 and the filter structure 420-3.

As described above, as the first transmission path distortion model and the second transmission path distortion model, a neural network including two or more layers may be used. Note that, with regard to the neural network with no intermediate layer illustrated in FIGS. 10 and 11, learning may be performed by using only an error norm ||Y−Z||, without using any regularization term. For example, a compressed sensing algorithm may be used that minimizes the error norm ||Y−Z|| effectively in a connection that is limited.

In the one or more example embodiments and example alterations described above, the filter structure 420 included in the first transmission path distortion model 400 enhances modeling accuracy. In such a configuration, the first transmission path distortion model 400 may have a structure of multistep filter. This configuration allows modeling accuracy to be further enhanced.

Figure 12:
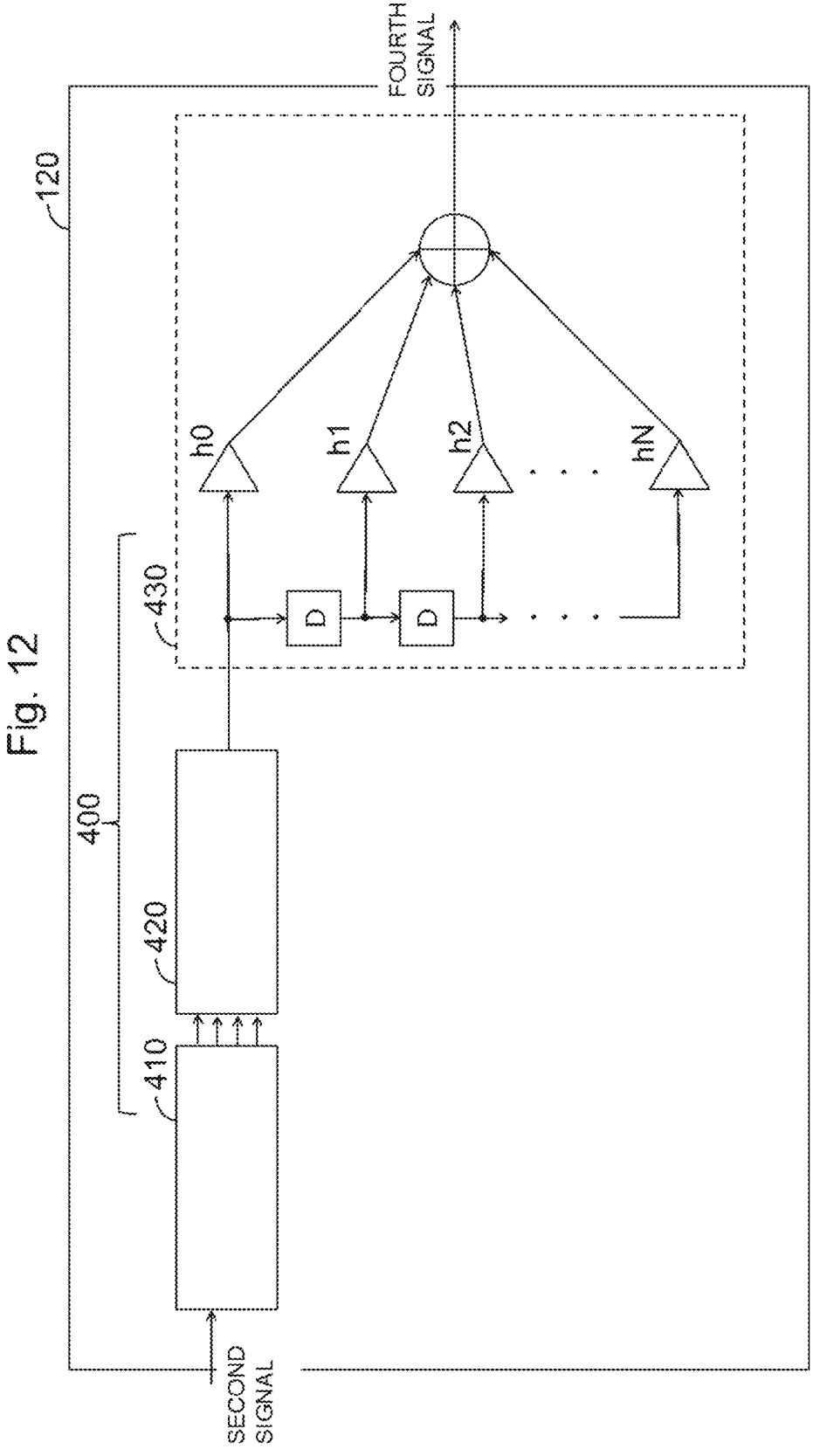
FIG. 12 is a diagram illustrating an example of the configuration of the transmission path distortion modeling processor according to the present disclosure.

FIG. 12 is a diagram illustrating an example of a configuration of the modeling processor 120. The first transmission path distortion model 400 includes a linear filter 430, in addition to the signal string mixture model 410 and the filter structure 420. The linear filter 430 is disposed after the filter structure 420. The configuration of each of the signal string mixture model 410 and the filter structure 420 is similar to that in the example described above, description of which is omitted.

For example, the linear filter 430 outputs, as the fourth signal, a signal obtained by multiplying output signals (including current values and past values) from the filter structure 420 by respective filter coefficients h0, . . . , hN and summing up the resultants.

The linear filter 430 may be a digital linear filter such as finite impulse response (FIR) or infinite impulse response (IIR).

Note that the linear filter 430 may be added to the examples of FIGS. 9 and 11. Pruning or compressed sensing algorithm may be applied to the example of FIG. 12 to reduce the operation amount.

3. Other Example Embodiments

Figure 13:
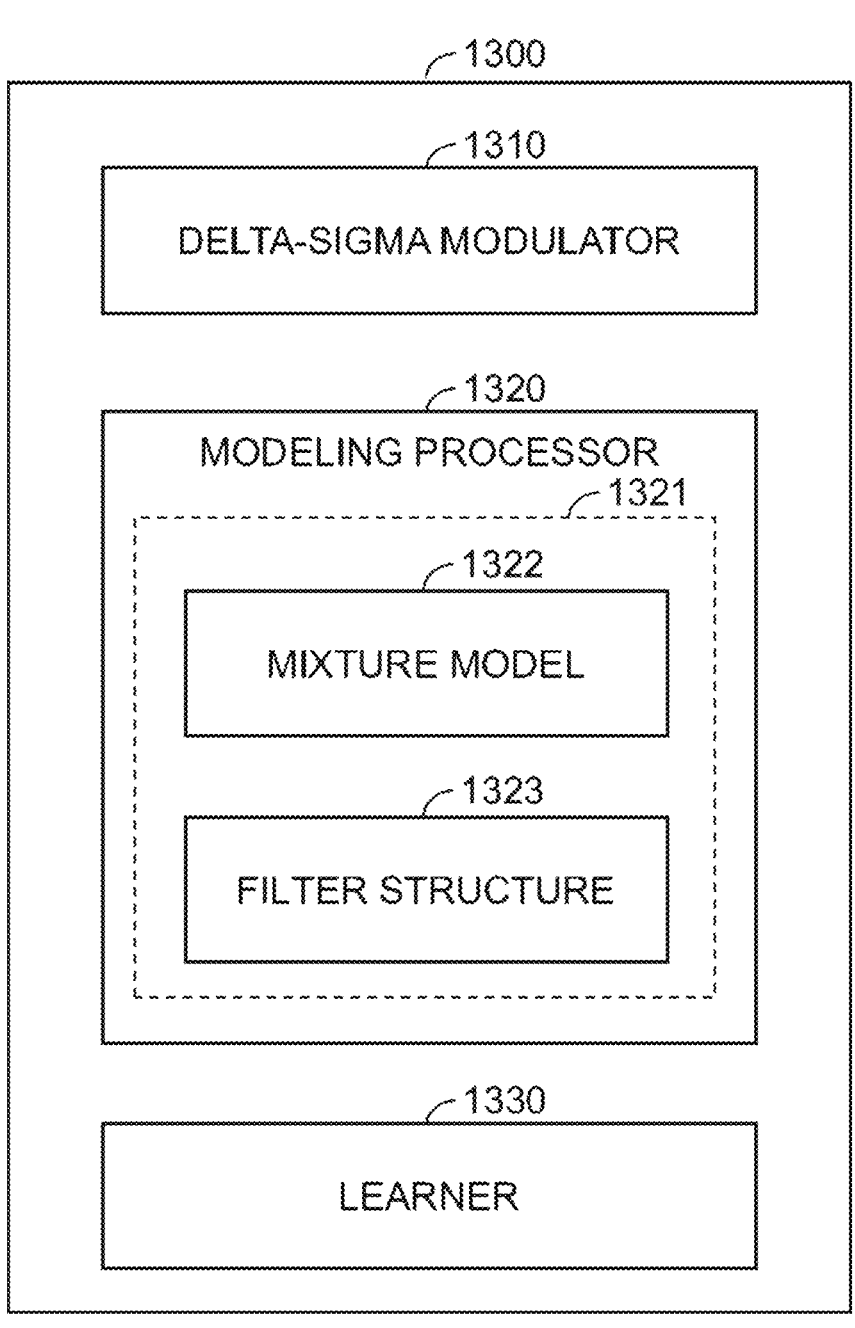
FIG. 13 is a diagram illustrating an example of the configuration of the delta-sigma modulation apparatus according to the present disclosure.

In the following, a more generalized example embodiment will be described. FIG. 13 is a diagram illustrating an example of a configuration of a delta-sigma modulation apparatus 1300. The delta-sigma modulation apparatus 1300 includes a delta-sigma modulator 1310, a modeling processor 1320, and a learner 1330.

The components 1310 to 1330 of the delta-sigma modulation apparatus 1300 may be implemented by one or more processors and a memory. The one or more processors may include, for example, one or more of a central processing unit (CPU), a micro processing unit (MPU), and a micro controller. The memory may include a volatile memory and a non-volatile memory. The memory may store a program code (instruction). The one or more processors may execute the program code stored in the memory to implement a function of the delta-sigma modulation apparatus 1300.

The delta-sigma modulator 1310 may have a configuration the same as that of the delta-sigma modulator 110 described above. The modeling processor 1320 may have a configuration the same as that of the modeling processor 120 described above. For example, the modeling processor 1320 includes a transmission path distortion model 1321. The transmission path distortion model 1321 at least includes a mixture model 1322 and a filter structure 1323. The transmission path distortion model 1321 may be the first transmission path distortion model 400, 400-2, or 400-3 described above. The learner 1330 may have a configuration the same as that of the learner 130 described above. The learner 1330 may include the second transmission path distortion model 500, 500-2, or 500-3 described above.

FIG. 14 is a flowchart for describing an example of a process flow of the delta-sigma modulation apparatus 1300.

The delta-sigma modulator 1310 performs delta-sigma modulation on the first signal as an external input signal and outputs the second signal (1401).

The learner 1330 learns a parameter for the transmission path distortion model 1321 including the mixture model 1322 and the filter structure 1323, by using the second signal and the third signal generated through the transmission path of the second signal (1402).

The modeling processor 1320 inputs the second signal to the transmission path distortion model 1321 and outputs the fourth signal that is an approximated value of a signal generated through at least part of the transmission path of the second signal (1403).

The delta-sigma modulator 1310 performs delta-sigma modulation on the first signal by using the fourth signal output from the modeling processor 1320, and outputs the second signal (1404).

The configuration described above provides the following effects. The feedback processing as described above allows the delta-sigma modulation apparatus 1300 to suppress transmission path distortion generated in the transmission path of the second signal.

Note that, after processing of step 1404, the delta-sigma modulation apparatus 1300 may repeatedly perform processing of step 1402 to step 1404.

4. Hardware Configuration of Delta-Sigma Modulation Apparatus

Figure 15:
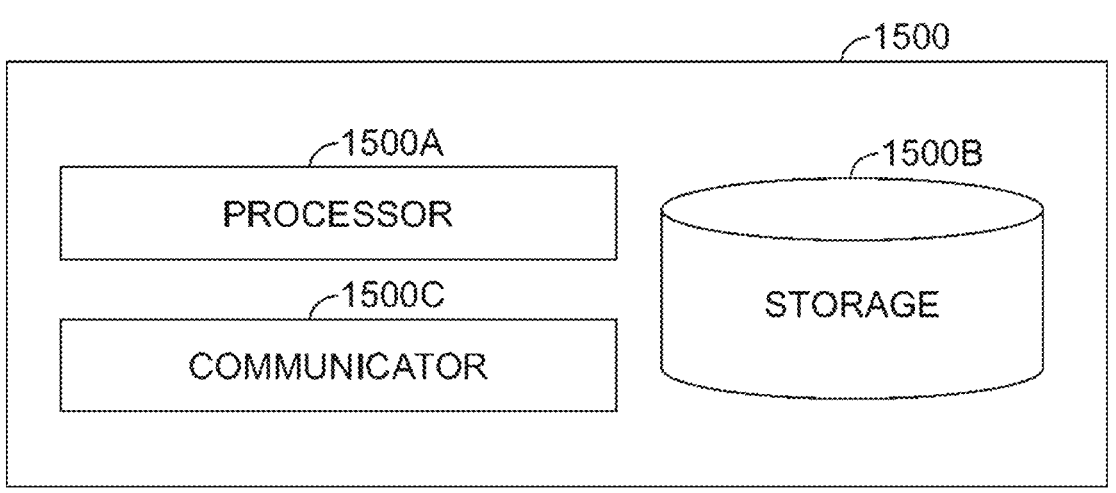
FIG. 15 is a diagram illustrating an example of a hardware configuration of the delta-sigma modulation apparatus according to the present disclosure.

FIG. 15 is a diagram illustrating an example of a hardware configuration of the delta-sigma modulation apparatus according to the one or more example embodiments. A delta-sigma modulation apparatus 1500 includes a processor 1500A, a storage 1500B, and a communicator 1500C.

The processor 1500A includes one or more processors. The one or more processors may include, for example, one or more of a CPU, an MPU, and a micro controller. The processor 1500A executes a program code stored in the storage 1500B to implement various functions of the delta-sigma modulation apparatus described above.

The storage 1500B includes a volatile memory and a non-volatile memory. The volatile memory may include, for example, a random access memory (RAM). The non-volatile memory may include, for example, one or more of a read only memory (ROM), a hard disk drive (HDD), and a solid state drive (SSD). The non-volatile memory stores a program code (instruction) for implementation of various functions of the delta-sigma modulation apparatus described above.

The communicator 1500C transmits a signal to another apparatus (for example, access point) and receives a signal from the other apparatus.

The example embodiments and example alterations described above are only examples, and the scope of technical idea of the present disclosure is not limited to the configuration described above. Other example aspects conceivable within the scope of technical idea of the present disclosure are also included in the scope of the present disclosure.

The processing steps illustrated in the flowchart or sequence diagram need not always be performed in such an order illustrated. The processing steps may be performed in an order different from an order illustrated, and two or more processing steps may be performed in parallel. Part of the processing steps may be deleted, or a further processing step may be added.

A function of the apparatus described in the Specification may be implemented by any one of software, hardware, and a combination of software and hardware. A program code (instruction) included in the software may be stored in, for example, a computer-readable recording medium internal or external of each apparatus and may be read by the memory in the execution for the execution. Moreover, a non-transitory computer readable recording medium (non-transitory computer readable medium) having recorded thereon the program code may be provided.

The whole or part of the example embodiments and example alterations disclosed above can be described as, but not limited to, the following supplementary notes.

Supplementary Note 1

A delta-sigma modulation apparatus comprising:
one or more memories storing instructions; and
one or more processors configured to execute the instructions to
    perform delta-sigma modulation on a first signal as an input signal, and output a second signal;
    learn a parameter for a transmission path distortion model including at least a mixture model and a filter structure, using the second signal and a third signal generated through a transmission path of the second signal; and
    input the second signal to the transmission path distortion model, and output a fourth signal that is an approximated value of a signal which is generated through at least part of the transmission path of the second signal,
    wherein the one or more processors are further configured to execute the instructions to perform the delta-sigma modulation on the first signal using the fourth signal, and output the second signal.

Supplementary Note 2

The delta-sigma modulation apparatus according to supplementary note 1, wherein
    the mixture model is configured to receive the second signal as an input signal and output a coefficient for the filter structure, and
    the filter structure is configured to apply the coefficient to the second signal and output the fourth signal.

Supplementary Note 3

The delta-sigma modulation apparatus according to supplementary note 1 or 2, wherein
    the transmission path distortion model further includes a linear filter, and
    the one or more processors are further configured to execute the instructions to apply the linear filter to an output of the filter structure and output the fourth signal.

Supplementary Note 4

The delta-sigma modulation apparatus according to supplementary note 3, wherein the linear filter is finite impulse response (FIR) or infinite impulse response (IIR).

Supplementary Note 5

The delta-sigma modulation apparatus according to any one of supplementary notes 1 to 4, wherein the mixture model includes a neural network including two or more layers.

Supplementary Note 6

The delta-sigma modulation apparatus according to supplementary note 5, wherein the one or more processors are further configured to execute the instructions to acquire information for reduction of part of operations in the mixture model and the filter structure, and reduce the part of the operations, based on the information.

Supplementary Note 7

The delta-sigma modulation apparatus according to supplementary note 5, wherein the one or more processors are further configured to execute the instructions to learn the parameter for the transmission path distortion model using a fifth signal and the third signal, the fifth signal being generated from the second signal through a model simulating the transmission path of the second signal.

Supplementary Note 8

The delta-sigma modulation apparatus according to supplementary note 7, wherein the one or more processors are further configured to execute the instructions to determine, using error propagation learning, the parameter for the transmission path distortion model to minimize an error norm between the fifth signal and the third signal.

Supplementary Note 9

A delta-sigma modulation method comprising:

performing delta-sigma modulation on a first signal as an input signal, and outputting a second signal;

learning a parameter for a transmission path distortion model including at least a mixture model and a filter structure, using the second signal and a third signal generated through a transmission path of the second signal;

inputting the second signal to the transmission path distortion model, and outputting a fourth signal that is an approximated value of a signal which is generated through at least part of the transmission path of the second signal; and performing the delta-sigma modulation on the first signal using the fourth signal, and outputting the second signal.

Supplementary Note 10

A non-transitory computer-readable recording medium having recorded thereon a program causing a processor to perform:

performing delta-sigma modulation on a first signal as an input signal, and outputting a second signal;

learning a parameter for a transmission path distortion model including at least a mixture model and a filter structure, using the second signal and a third signal generated through a transmission path of the second signal;

inputting the second signal to the transmission path distortion model, and outputting a fourth signal that is an approximated value of a signal which is generated through at least part of the transmission path of the second signal; and performing the delta-sigma modulation on the first signal using the fourth signal, and outputting the second signal.

What is claimed is:

1. A delta-sigma modulation apparatus comprising:

one or more memories storing instructions; and one or more processors configured to execute the instructions to perform delta-sigma modulation on a first signal as an input signal, and output a second signal;

learn a parameter for a transmission path distortion model including at least a mixture model and a filter structure, using the second signal and a third signal generated through a transmission path of the second signal; and input the second signal to the transmission path distortion model, and output a fourth signal that is an approximated value of a signal which is generated through at least part of the transmission path of the second signal, wherein the one or more processors are further configured to execute the instructions to perform the delta-sigma modulation on the first signal using the fourth signal, and output the second signal.

2. The delta-sigma modulation apparatus according to claim 1, wherein the mixture model is configured to receive the second signal as an input signal and output a coefficient for the filter structure, and the filter structure is configured to apply the coefficient to the second signal and output the fourth signal.

3. The delta-sigma modulation apparatus according to claim 1, wherein the transmission path distortion model further includes a linear filter, and the one or more processors are further configured to execute the instructions to apply the linear filter to an output of the filter structure and output the fourth signal.

4. The delta-sigma modulation apparatus according to claim 3, wherein the linear filter is finite impulse response (FIR) or infinite impulse response (IIR).

5. The delta-sigma modulation apparatus according to claim 1, wherein the mixture model includes a neural network including two or more layers.

6. The delta-sigma modulation apparatus according to claim 5, wherein the one or more processors are further configured to execute the instructions to acquire information for reduction of part of operations in the mixture model and the filter structure, and reduce the part of the operations, based on the information.

7. The delta-sigma modulation apparatus according to claim 5, wherein the one or more processors are further configured to execute the instructions to learn the parameter for the transmission path distortion model using a fifth signal and the third signal, the fifth signal being generated from the second signal through a model simulating the transmission path of the second signal.

8. The delta-sigma modulation apparatus according to claim 7, wherein the one or more processors are further configured to execute the instructions to determine, using error propagation learning, the parameter for the transmission path distortion model to minimize an error norm between the fifth signal and the third signal.

9. A delta-sigma modulation method comprising:

performing delta-sigma modulation on a first signal as an input signal, and outputting a second signal;

learning a parameter for a transmission path distortion model including at least a mixture model and a filter structure, using the second signal and a third signal generated through a transmission path of the second signal;

inputting the second signal to the transmission path distortion model, and outputting a fourth signal that is an approximated value of a signal which is generated through at least part of the transmission path of the second signal; and performing the delta-sigma modulation on the first signal using the fourth signal, and outputting the second signal.

10. A non-transitory computer-readable recording medium having recorded thereon a program causing a processor to perform:

performing delta-sigma modulation on a first signal as an input signal, and outputting a second signal;

learning a parameter for a transmission path distortion model including at least a mixture model and a filter structure, using the second signal and a third signal generated through a transmission path of the second signal;

inputting the second signal to the transmission path distortion model, and outputting a fourth signal that is an approximated value of a signal which is generated through at least part of the transmission path of the second signal; and performing the delta-sigma modulation on the first signal using the fourth signal, and outputting the second signal.

\* \* \* \* \*